US009640555B2

(12) United States Patent
Okazaki et al.

(10) Patent No.: US 9,640,555 B2
(45) Date of Patent: May 2, 2017

(54) SEMICONDUCTOR DEVICE INCLUDING OXIDE SEMICONDUCTOR

(71) Applicant: Semiconductor Energy Laboratory Co., Ltd., Atsugi-shi, Kanagawa-ken (JP)

(72) Inventors: Kenichi Okazaki, Tochigi (JP); Junichi Koezuka, Tochigi (JP); Masami Jintyou, Tochigi (JP); Takahiro Iguchi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/733,052

(22) Filed: Jun. 8, 2015

(65) Prior Publication Data

US 2015/0372022 A1    Dec. 24, 2015

(30) Foreign Application Priority Data

Jun. 20, 2014   (JP) ................................. 2014-126787

(51) Int. Cl.
*H01L 29/786*      (2006.01)
*H01L 27/12*       (2006.01)
(Continued)

(52) U.S. Cl.
CPC ........ *H01L 27/1225* (2013.01); *H01L 29/513* (2013.01); *H01L 29/66969* (2013.01); *H01L 29/7869* (2013.01)

(58) Field of Classification Search
CPC ........... H01L 29/7869; H01L 29/78696; H01L 29/51; H01L 29/511; H01L 29/513;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    103137496 A    6/2013
CN    103779423 A    5/2014
(Continued)

OTHER PUBLICATIONS

International Search Report (Application No. PCT/IB2015/054335) Dated Sep. 8, 2015.
(Continued)

*Primary Examiner* — Davienne Monbleau
*Assistant Examiner* — Leslie Pilar Cruz
(74) *Attorney, Agent, or Firm* — Fish & Richardson P.C.

(57) ABSTRACT

A change in electrical characteristics can be inhibited and reliability can be improved in a semiconductor device including an oxide semiconductor. The semiconductor device including an oxide semiconductor film includes a first insulating film, the oxide semiconductor film over the first insulating film, a second insulating film over the oxide semiconductor film, and a third insulating film over the second insulating film. The second insulating film includes oxygen and silicon, the third insulating film includes nitrogen and silicon, and indium is included in a vicinity of an interface between the second insulating film and the third insulating film.

24 Claims, 23 Drawing Sheets

(51) Int. Cl.
  *H01L 29/51* (2006.01)
  *H01L 29/66* (2006.01)
(58) Field of Classification Search
  CPC ..... H01L 29/78693; H01L 2924/13069; H01L 27/3258; H01L 27/1225; H01L 27/1248
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 8,148,721 B2 | 4/2012 | Hayashi et al. |
| 8,551,824 B2 | 10/2013 | Yamazaki et al. |
| 8,785,258 B2 | 7/2014 | Yamazaki |
| 8,828,794 B2 | 9/2014 | Yamazaki et al. |
| 8,828,811 B2 | 9/2014 | Yamazaki |
| 8,865,534 B2 | 10/2014 | Yamazaki |
| 8,945,982 B2 | 2/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123130 A1 | 5/2010 | Akimoto et al. |
| 2011/0212569 A1 | 9/2011 | Yamazaki et al. |
| 2011/0284844 A1 | 11/2011 | Endo et al. |
| 2011/0284854 A1 | 11/2011 | Endo et al. |
| 2012/0018727 A1 | 1/2012 | Endo et al. |
| 2012/0052602 A1 | 3/2012 | Hatano et al. |
| 2012/0248433 A1 | 10/2012 | Nakano et al. |
| 2012/0293204 A1 | 11/2012 | Nishijima |
| 2012/0300151 A1 | 11/2012 | Yamazaki et al. |
| 2013/0137232 A1 | 5/2013 | Ito et al. |
| 2013/0140553 A1 | 6/2013 | Yamazaki et al. |
| 2013/0193432 A1* | 8/2013 | Yamazaki ........... H01L 29/7869 257/43 |
| 2013/0248858 A1 | 9/2013 | Morita et al. |
| 2013/0270549 A1 | 10/2013 | Okazaki et al. |
| 2013/0270550 A1* | 10/2013 | Okazaki ............. H01L 29/7869 257/43 |
| 2013/0341617 A1 | 12/2013 | Tao et al. |
| 2014/0001467 A1 | 1/2014 | Yamazaki et al. |
| 2014/0110705 A1 | 4/2014 | Koezuka et al. |
| 2014/0112153 A1 | 4/2014 | Jin et al. |
| 2014/0151686 A1 | 6/2014 | Yamazaki et al. |
| 2014/0154837 A1 | 6/2014 | Yamazaki |
| 2014/0225103 A1 | 8/2014 | Tezuka et al. |
| 2014/0319517 A1 | 10/2014 | Noda et al. |
| 2015/0249157 A1 | 9/2015 | Yamazaki et al. |
| 2015/0249160 A1 | 9/2015 | Yamazaki et al. |
| 2015/0270407 A1 | 9/2015 | Suzuki et al. |
| 2015/0303309 A1 | 10/2015 | Koezuka et al. |
| 2015/0348998 A1 | 12/2015 | Koezuka et al. |
| 2015/0355095 A1 | 12/2015 | Hayashi et al. |
| 2016/0079089 A1 | 3/2016 | Koezuka et al. |

FOREIGN PATENT DOCUMENTS

| | | |
|---|---|---|
| DE | 102013221370 | 4/2014 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2011-199272 A | 10/2011 |
| JP | 2012-009836 A | 1/2012 |
| JP | 2013-138188 A | 7/2013 |
| JP | 2014-007381 A | 1/2014 |
| JP | 2014-199907 A | 10/2014 |
| JP | 2014-232867 A | 12/2014 |
| KR | 2013-0061633 A | 6/2013 |
| KR | 2013-0116204 A | 10/2013 |
| KR | 2014-0052869 A | 5/2014 |
| TW | 201332022 | 8/2013 |
| TW | 201423997 | 6/2014 |
| TW | 201501312 | 1/2015 |
| WO | WO-2004/114391 | 12/2004 |
| WO | WO-2014/178357 | 11/2014 |

OTHER PUBLICATIONS

Written Opinion (Application No. PCT/IB2015/054335) Dated Sep. 8, 2015.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05 : Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102.3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advance Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m =3, 4, and 5), InGaO3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letter), Jan. 26, 2007, vol. 98, pp. 045501-1-045501-4.

Lee.H et al., "Current Status of, Challenges to, and Perspective View of AM-OLED", IDW '06 : Proceeding of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M et al., "The phase relations in the In2O3—Ga2ZnO4-ZnO system at 1350° C. ", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of The 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Ryu.B et al., "O-vacancy as the origin of negative bias illumination stress instability in amorphous In—Ga—Zn—O thin film transistors", Appl. Phys. Lett. (Applied Physics Letters), 2010, vol. 97, No. 2, pp. 022108-1-022108-3.

* cited by examiner

SEMICONDUCTOR DEVICE INCLUDING OXIDE SEMICONDUCTOR

TECHNICAL FIELD

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention (e.g., Patent Document 1).

Furthermore, for example, Patent Document 2 discloses a semiconductor device in which, to reduce oxygen vacancy in an oxide semiconductor layer where a channel is formed, an insulating film which releases oxygen by heating is used as a base insulating layer of the oxide semiconductor layer.

REFERENCE

Patent Document

[Patent Document 1] Japanese Published Patent Application No. 2006-165529
[Patent Document 2] Japanese Published Patent Application No. 2012-009836

DISCLOSURE OF INVENTION

In the case where a transistor is manufactured using an oxide semiconductor film for a channel region, oxygen vacancy formed in the channel region in the oxide semiconductor film adversely affects the transistor characteristics; therefore, the oxygen vacancy causes a problem. For example, oxygen vacancy formed in the channel region in the oxide semiconductor film is bonded with hydrogen to serve as a carrier supply source. The carrier supply source generated in the channel region in the oxide semiconductor film causes a change in the electrical characteristics, typically, shift in the threshold voltage, of the transistor including the oxide semiconductor film. Furthermore, there is a problem in that electrical characteristics fluctuate among the transistors. Therefore, it is preferable that the amount of oxygen vacancy in the channel region of the oxide semiconductor film be as small as possible.

In view of the above problem, an object of one embodiment of the present invention is to inhibit a change in electrical characteristics and to improve reliability in a semiconductor device including an oxide semiconductor. Another object of one embodiment of the present invention is to provide a semiconductor device with low power consumption. Another object of one embodiment of the present invention is to provide a novel semiconductor device. Another object of one embodiment of the present invention is to provide a novel display device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device including an oxide semiconductor film, and the semiconductor device includes a first insulating film, the oxide semiconductor film over the first insulating film, a second insulating film over the oxide semiconductor film, and a third insulating film over the second insulating film. The second insulating film includes oxygen and silicon, the third insulating film includes nitrogen and silicon, and indium is included in a vicinity of an interface between the second insulating film and the third insulating film.

Another embodiment of the present invention is a semiconductor device including an oxide semiconductor film, and the semiconductor device includes a gate electrode, a first insulating film over the gate electrode, the oxide semiconductor film over the first insulating film, a source electrode electrically connected to the oxide semiconductor film, a drain electrode electrically connected to the oxide semiconductor film, a second insulating film over the oxide semiconductor film, the source electrode, and the drain electrode; and a third insulating film over the second insulating film. The second insulating film includes oxygen and silicon, the third insulating film includes nitrogen and silicon, and indium is included in a vicinity of an interface between the second insulating film and the third insulating film.

In any of the above structures, the indium is preferably detected by secondary ion mass spectrometry.

In any of the above structures, the oxide semiconductor film preferably includes O, In, Zn, and M (M is Ti, Ga, Sn, Y, Zr, La, Ce, Nd, or Hf). In any of the above structures, it is preferable that the oxide semiconductor film include a crystal part, the crystal part include a portion, and a c-axis of the portion be parallel to a normal vector of a surface where the oxide semiconductor film is formed.

Another embodiment of the present invention is a display device including the semiconductor device according to any one of the above structures, and a display element. Another embodiment of the present invention is a display module including the display device and a touch sensor. Another embodiment of the present invention is an electronic appliance including the semiconductor device according to any one of the above structures, the display device, or the display module; and an operation key or a battery.

According to one embodiment of the present invention, a change in electrical characteristics can be inhibited and reliability can be improved in a semiconductor device including an oxide semiconductor. Alternatively, according to one embodiment of the present invention, a semiconductor device with low power consumption can be provided. According to one embodiment of the present invention, a novel semiconductor device can be provided. According to one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BEST MODE FOR CARRYING OUT THE INVENTION

Figure 1A:
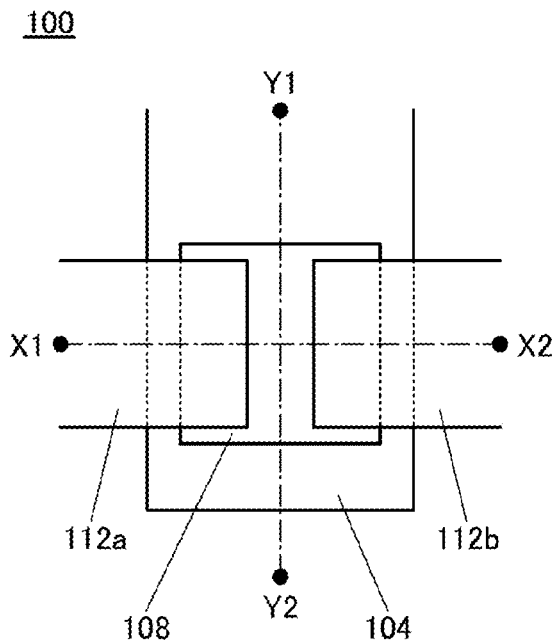
FIGS. 1A to 1C are a top view and cross-sectional views illustrating one embodiment of a semiconductor device.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

Note that in this specification and the like, the vicinity of an interface means regions above and below the interface each in the range of ±5 nm. In a state where different films are stacked in a horizontal direction, a compound may be formed in the vicinity of the interface at which the different films are in contact with each other. The vicinity of the interface in this case is in the range including the compound, a region 5 nm above the compound, and a region 5 nm below the compound.

[Embodiment 1]

In this embodiment, a semiconductor device of one embodiment of the present invention will be described with reference to FIGS. 1A to 1C, FIGS. 2A to 2D, FIGS. 3A and 3B, FIGS. 4A to 4C, FIGS. 5A to 5C, FIGS. 6A to 6C, FIGS. 7A to 7D, FIGS. 8A and 8B, FIGS. 9A to 9D, FIGS. 10A to 10D, FIGS. 11A to 11D, FIGS. 12A and 12B, FIGS. 13A to 13D, and FIGS. 14A to 14D.

<Structure Example 1 of Semiconductor Device>

Figure 1B:
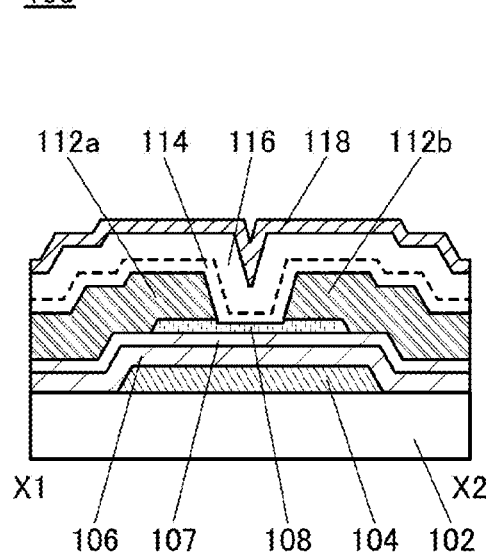
Figure 1C:
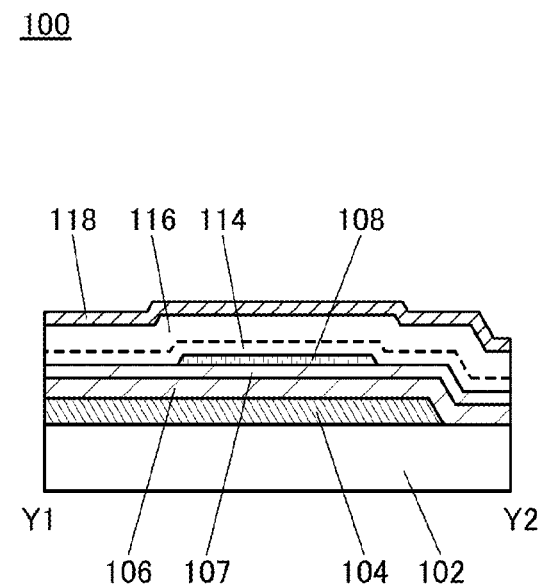

FIG. 1A is a top view of a transistor 100 that is a semiconductor device of one embodiment of the present invention. FIG. 1B is a cross-sectional view taken along a dashed dotted line X1-X2 in FIG. 1A, and FIG. 1C is a cross-sectional view taken along a dashed dotted line Y1-Y2 in FIG. 1A. Note that in FIG. 1A, some components of the transistor 100 (e.g., an insulating film functioning as a gate insulating film) are not illustrated to avoid complexity. Furthermore, the direction of the dashed dotted line X1-X1 may be called a channel length direction, and the direction of the dashed dotted line Y1-Y2 may be called a channel width direction. As in FIG. 1A, some components are not illustrated in some cases in top views of transistors described below.

The transistor 100 includes a conductive film 104 functioning as a first gate electrode over a substrate 102, an insulating film 106 over the substrate 102 and the conductive film 104, an insulating film 107 over the insulating film 106, an oxide semiconductor film 108 over the insulating film 107, a conductive film 112a functioning as a source electrode electrically connected to the oxide semiconductor film 108, and a conductive film 112b functioning as a drain electrode electrically connected to the oxide semiconductor film 108. Over the conductive films 112a and 112b and the oxide semiconductor film 108, insulating films 114 and 116 and an insulating film 118 are provided. The insulating films 114, 116, and 118 function as protective insulating films for the transistor 100.

The transistor 100 includes indium in the vicinity of an interface between the insulating film 116 and the insulating film 118. In other words, indium is detected in the vicinity of the interface between the insulating film 116 and the insulating film 118. The reason why indium is detected will be described later.

The insulating film 106 and the insulating film 107 each function as a gate insulating film of the transistor 100. In some cases, the insulating films 106 and 107 are collectively referred to as a first insulating film, the insulating films 114 and 116 are collectively referred to as a second insulating film, and the insulating film 118 is referred to as a third insulating film.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108. In the structure of the transistor of one embodiment of the present invention, excess oxygen is introduced into an insulating film over the oxide semiconductor film 108, here, the insulating film 114 over the oxide semiconductor film 108, whereby oxygen is moved from the insulating film 114 to the oxide semiconductor film 108 to fill oxygen vacancy in the oxide semiconductor film 108. Alternatively, excess oxygen is introduced into the insulating film 116 over the oxide semiconductor film 108, whereby oxygen is moved from the insulating film 116 to the oxide semiconductor film 108 through the insulating film 114 to fill oxygen vacancy in the oxide semiconductor film 108. Alternatively, excess oxygen is introduced into the insulating films 114 and 116 over the oxide semiconductor film 108, whereby oxygen is moved from both the insulating films 114 and 116 to the oxide semiconductor film 108 to fill oxygen vacancy in the oxide semiconductor film 108.

Therefore, the insulating films 114 and 116 include oxygen. The insulating films 114 and 116 preferably include oxygen and silicon. Specifically, the insulating films 114 and 116 each include a region (oxygen excess region) including oxygen in excess of that in the stoichiometric composition. In other words, the insulating films 114 and 116 are each an insulating film capable of releasing oxygen. Note that the oxygen excess region is formed in each of the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed. Note that for the above plasma treatment, an apparatus with which an oxygen gas is made to be plasma by high-frequency power (also referred to as a plasma etching apparatus or a plasma ashing apparatus) is preferably used.

The amount of oxygen molecules released from the insulating film capable of releasing oxygen can be measured by thermal desorption spectroscopy (TDS). For example, the amount of oxygen molecules released from each of the insulating films 114 and 116 is preferably greater than or equal to $1 \times 10^{19}/cm^3$ when measured by TDS. Note that the substrate temperature in the TDS analysis is preferably higher than or equal to 100° C. and lower than or equal to 700° C. or higher than or equal to 100° C. and lower than or equal to 500° C.

According to one embodiment of the present invention, a film having a function of inhibiting release of oxygen is formed over the insulating film 116 and oxygen is introduced into the insulating films 114 and 116 through the film having a function of inhibiting release of oxygen, so that the oxygen excess region is formed in the insulating films 114 and 116. The film having a function of inhibiting release of oxygen is preferably a conductive film including indium or a semiconductor film including indium. Moreover, the film having a function of inhibiting release of oxygen is preferably removed after oxygen introduction.

For the film having a function of inhibiting release of oxygen, for example, indium (In) and a material including one of zinc (Zn), tin (Sn), tungsten (W), titanium (Ti), and silicon (Si) can be used. In particular, for the film having a function of inhibiting release of oxygen, a light-transmitting conductive material such as indium oxide including tungsten oxide, indium zinc oxide including tungsten oxide, indium oxide including titanium oxide, indium tin oxide (ITO), indium tin oxide including titanium oxide, indium zinc oxide, or indium tin oxide including silicon oxide (indium tin $SiO_2$ doped oxide; ITSO) can be used.

In the case where the film having a function of inhibiting release of oxygen is formed over the insulating film 116 and oxygen is introduced into the insulating films 114 and 116 through the film having a function of inhibiting release of oxygen, indium is detected in the vicinity of the surface of the insulating film 116, that is, the vicinity of the interface between the insulating film 116 and the insulating film 118. This is because when oxygen is introduced into the insulating films 114 and 116 through the film having a function of inhibiting release of oxygen, which includes indium, indium is introduced into a region in the vicinity of the surface of the insulating film 116.

Indium detected in the vicinity of the surface of the insulating film 116 is described below with reference to FIGS. 2A to 2D and FIGS. 3A and 3B.

Figure 2A:
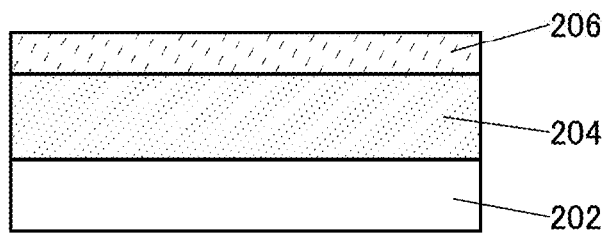
FIGS. 2A to 2D are cross-sectional views illustrating one embodiment of a semiconductor device and an example of a manufacturing process of the semiconductor device.
Figure 2B:
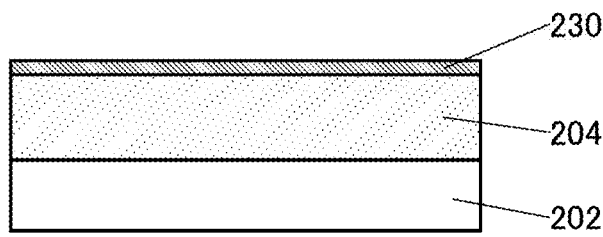
Figure 2C:
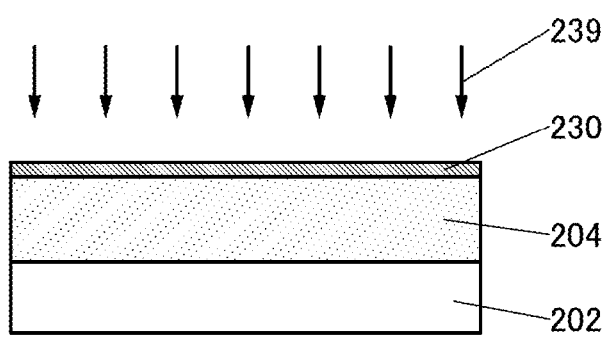
Figure 2D:
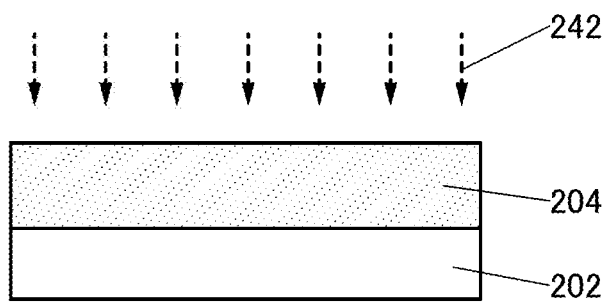

FIG. 2A is a cross-sectional view of a semiconductor device 200, and FIGS. 2B to 2D are cross-sectional views illustrating an example of a manufacturing process of the semiconductor device 200 illustrated in FIG. 2A.

The semiconductor device 200 in FIG. 2A includes an insulating film 204 over a substrate 202 and an insulating film 206 over the insulating film 204.

Note that the semiconductor device 200 in FIG. 2A is a sample for analysis which was fabricated to examine indium detected in the vicinity of the surface of the insulating film 116 in FIGS. 1A to 1C. Note that the insulating film 204 corresponds to the insulating film 116 in FIGS. 1A to 1C.

A glass substrate was used as the substrate 202, a 400-nm-thick silicon oxynitride film was used as the insulating film 204, and a 200-nm-thick silicon oxynitride film was used as the insulating film 206.

As the semiconductor device 200 in FIG. 2A, Sample A1 which is one embodiment of the present invention and Sample A2 for comparison were fabricated, and the detected amount of indium in the vicinity of the interface between the insulating film 204 and the insulating film 206 was examined. Methods for fabricating Sample A1 and Sample A2 are described below.

<Sample A1>

First, the insulating film 204 was formed over the substrate 202, and a film 230 having a function of inhibiting release of oxygen was formed over the insulating film 204 (see FIG. 2B).

The insulating film 204 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus. As the film 230 having a function of inhibiting release of oxygen, a 5-nm-thick ITSO film was formed with a sputtering apparatus. The composition of a target used for forming the ITSO film was $In_2O_3:SnO_2:SiO_2=85:10:5$ [wt %].

Next, oxygen 239 was added through the film 230 having a function of inhibiting release of oxygen (see FIG. 2C).

The oxygen 239 was added with an ashing apparatus under the conditions where an oxygen gas at a flow rate of 250 sccm was introduced into a chamber, the pressure was 15 Pa, and an RF power of 4500 W was supplied between parallel-plate electrodes provided in the ashing apparatus so that a bias would be applied to the substrate side.

Next, the film 230 having a function of inhibiting release of oxygen was removed using an etchant 242 (see FIG. 2D).

The film 230 having a function of inhibiting release of oxygen was processed using, as the etchant 242, an oxalic acid solution at a concentration of 5% and then hydrofluoric acid at a concentration of 0.5% for 300 sec. and 15 sec., respectively.

Next, the insulating film 206 was formed over the insulating film 204. Thus, the semiconductor device 200 in FIG. 2A was fabricated. The insulating film 206 was deposited under the conditions where the substrate temperature was 330° C., a silane gas at a flow rate of 75 sccm and a dinitrogen monoxide gas at a flow rate of 1200 sccm were introduced into a chamber, the pressure was 70 Pa, and an RF power of 120 W was supplied between parallel-plate electrodes provided in a PECVD apparatus.

<Sample A2>

As compared with Sample A1 described above, Sample A2 was not subjected to oxygen addition treatment in FIG. 2C. That is, in Sample A2, the film 230 having a function of inhibiting release of oxygen was formed over the insulating film 204 and was then removed without being subjected to the oxygen addition treatment, and then the insulating film 206 was formed.

Figure 3A:
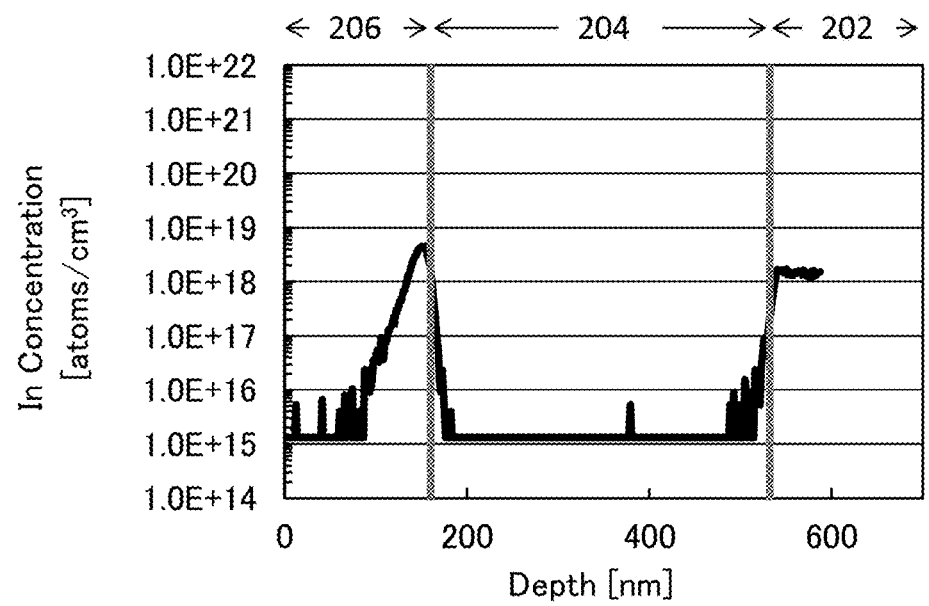
FIGS. 3A and 3B show the results of SIMS analysis.
Figure 3B:
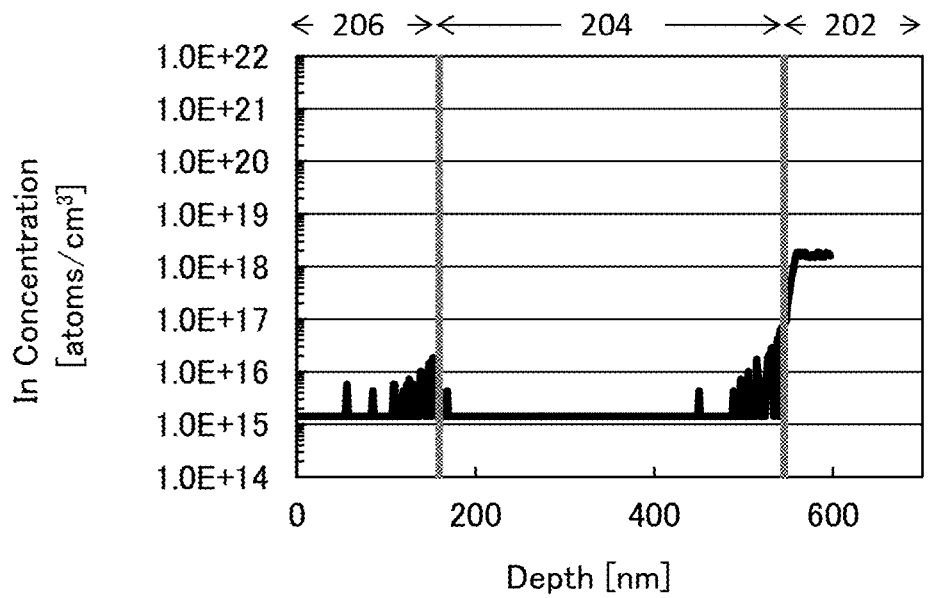

Next, to measure the concentrations of indium in the insulating films 204 and 206 in Sample A1 and Sample A2 which were fabricated as described above, analysis was performed by secondary ion mass spectrometry (SIMS). FIG. 3A shows the analysis result of Sample A1, and FIG. 3B shows the analysis result of Sample A2. In FIGS. 3A and 3B, the horizontal axis and the vertical axis represent the depth (nm) and the concentration of indium (atoms/cm$^3$), respectively.

According to the results shown in FIGS. 3A and 3B, in Sample A1, the concentration of indium in the vicinity of the interface between the insulating film 204 and the insulating film 206 was greater than or equal to $5\times10^{16}$ atoms/cm$^3$, whereas in Sample A2, the concentration of indium in the vicinity of the interface between the insulating film 204 and the insulating film 206 was less than $5\times10^{16}$ atoms/cm$^3$. Note that the minimum detection limit of indium in the SIMS analysis is $1\times10^{15}$ atoms/cm$^3$.

It is difficult in measurement principle to obtain accurate data in the vicinity of a surface of a sample or in the vicinity of an interface between stacked films by SIMS analysis. However, when Sample A1 and Sample A2 are compared to each other, the detected amount of indium in the vicinity of the interface between the insulating film 204 and the insulating film 206 in Sample A1 is larger than that in Sample A2.

According to the results shown in FIGS. 3A and 3B, in Sample A1, indium in the ITSO film used as the film having a function of inhibiting release of oxygen was introduced into the insulating film 204 at the oxygen addition treatment, whereas in Sample A2, no indium or a slight amount of indium was introduced into the insulating film 204 because oxygen addition treatment was not performed after the film having a function of inhibiting release of oxygen was formed over the insulating film 204.

As described above, in the case where the film having a function of inhibiting release of oxygen is formed over the insulating film and oxygen is introduced into the insulating film through the film having a function of inhibiting release of oxygen, indium which is a constituent element of the film having a function of inhibiting release of oxygen is introduced into the insulating film.

In the semiconductor device of one embodiment of the present invention, the insulating films 114 and 116 are formed over the oxide semiconductor film 108. After that, the film having a function of inhibiting release of oxygen is formed over the insulating film 116 and oxygen is supplied to the insulating films 114 and 116 through the film having a function of inhibiting release of oxygen, whereby excess oxygen is included in the insulating films 114 and 116. The excess oxygen included in the insulating films 114 and 116 fills oxygen vacancy formed in the oxide semiconductor film 108. The oxygen vacancy in the oxide semiconductor film 108 is filled, whereby a highly reliable semiconductor device can be provided.

Other constituent elements of the semiconductor device of this embodiment are described below in detail.

<Substrate>

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<Conductive Film>

The conductive film 104 functioning as a first gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<Gate Insulating Film>

As each of the insulating films 106 and 107 functioning as first gate insulating films of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the thickness of the insulating film can be increased. This makes it possible to reduce a decrease in withstand voltage of the transistor 100 and furthermore to increase the withstand voltage, thereby reducing electrostatic discharge damage to the transistor 100.

<Oxide Semiconductor Film>

The oxide semiconductor film 108 contains O, In, Zn, and M (M is Ti, Ga, Sn, Y, Zr, La, Ce, Nd, or Hf). Typically, In—Ga oxide, In—Zn oxide, or In-M-Zn oxide can be used for the oxide semiconductor film 108. It is particularly preferable to use In-M-Zn oxide for the oxide semiconductor film 108.

In the case where the oxide semiconductor film 108 is formed of In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

Note that in the case where the oxide semiconductor film 108 is In-M-Zn oxide, the proportion of In and the proportion of M, not taking Zn and O into consideration, are preferably greater than 25 atomic % and less than 75 atomic %, respectively, and further preferably greater than 34 atomic % and less than 66 atomic %, respectively.

The energy gap of the oxide semiconductor film 108 is 2 eV or more, preferably 2.5 eV or more and further preferably 3 eV or more. With the use of an oxide semiconductor having such a wide energy gap, the off-state current of the transistor 100 can be reduced.

The thickness of the oxide semiconductor film 108 is greater than or equal to 3 nm and less than or equal to 200 nm, preferably greater than or equal to 3 nm and less than or equal to 100 nm and further preferably greater than or equal to 3 nm and less than or equal to 50 nm.

An oxide semiconductor film with low carrier density is used as the oxide semiconductor film 108. For example, an oxide semiconductor film whose carrier density is lower than or equal to $1 \times 10^{17}/cm^3$, preferably lower than or equal to $1 \times 10^{15}/cm^3$, further preferably lower than or equal to $1 \times 10^{13}/cm^3$, and still further preferably lower than or equal to $1 \times 10^{11}/cm^3$ is used as the oxide semiconductor film 108.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

Note that it is preferable to use, as the oxide semiconductor film 108, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width W of $1 \times 10^6$ μm and a channel length L of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film 108 reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than or equal to $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, and further preferably lower than or equal to $1 \times 10^{16}$ atoms/cm$^3$.

When silicon or carbon that is one of elements belonging to Group 14 is included in the oxide semiconductor film 108, oxygen vacancy is increased in the oxide semiconductor film 108, and the oxide semiconductor film 108 becomes an n-type film. Thus, the concentration of silicon or carbon (the concentration is measured by SIMS) in the oxide semiconductor film 108 or the concentration of silicon or carbon (the concentration is measured by SIMS) in the vicinity of an interface with the oxide semiconductor film 108 is set to be lower than or equal to $2 \times 10^{18}$ atoms/cm$^3$, preferably lower than or equal to $2 \times 10^{17}$ atoms/cm$^3$.

In addition, the concentration of alkali metal or alkaline earth metal of the oxide semiconductor film 108, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108.

Furthermore, when including nitrogen, the oxide semiconductor film 108 easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

The oxide semiconductor film 108 may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect states, whereas CAAC-OS has the lowest density of defect states.

The oxide semiconductor film 108 may have an amorphous structure, for example. The oxide semiconductor films having the amorphous structure each have disordered atomic arrangement and no crystalline component, for example. Alternatively, the oxide films having an amorphous structure have, for example, an absolutely amorphous structure and no crystal part.

Note that the oxide semiconductor film 108 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

<Protective Insulating Film>

The insulating films 114, 116, and 118 function as protective insulating films. The insulating films 114 and 116 include oxygen. Furthermore, the insulating film 114 is an insulating film which can transmit oxygen. Note that the insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in TDS analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than or equal to 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the vicinity of the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C., higher than or equal to 280° C., or higher than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Moreover, indium is detected in the vicinity of the surface of the insulating film 116.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films which are described above can be formed by a sputtering method or a PECVD method, such films may be formed by another method, e.g., a thermal CVD method. As an example of a thermal CVD method, a metal organic chemical vapor deposition (MOCVD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a $Ga(CH_3)_3$ gas and an $O_3$ gas are sequentially introduced plural times to form a GaO layer, and then a $Zn(CH_3)_2$ gas and an $O_3$ gas are sequentially introduced plural times to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<Structure Example 2 of Semiconductor Device>

Structure examples different from that of the transistor 100 in FIGS. 1A to 1C are described with reference to FIGS. 4A to 4C. Note that in the case where a portion has a function similar to that described above, the same hatch pattern is applied to the portion, and the portion is not especially denoted by a reference numeral in some cases.

Figure 4A:
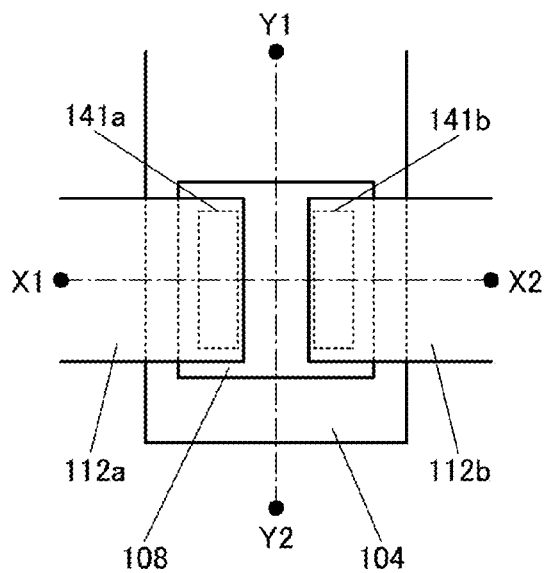
FIGS. 4A to 4C are a top view and cross-sectional views illustrating one embodiment of a semiconductor device.

FIG. 4A is a top view of a transistor 150 that is a semiconductor device of one embodiment of the present invention. FIG. 4B is a cross-sectional view taken along dashed-dotted line X1-X2 illustrated in FIG. 4A, and FIG. 4C is a cross-sectional view taken along dashed-dotted line Y1-Y2 illustrated in FIG. 4A.

The transistor 150 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112a functioning as a source electrode electrically connected to the oxide semiconductor film 108 through an opening 141a provided in the insulating films 114 and 116, and the conductive film 112b functioning as a drain electrode electrically connected to the oxide semiconductor film 108 through an opening 141b provided in the insulating films 114 and 116. Over the transistor 150, specifically, over the conductive films 112*a* and 112*b* and the insulating film 116, the insulating film 118 is provided. The insulating films 114 and 116 function as protective insulating films for the oxide semiconductor film 108. The insulating film 118 functions as a protective insulating film for the transistor 150.

The transistor 150 includes indium in the vicinity of an interface between the insulating film 116 and the insulating film 118.

Figure 4B:
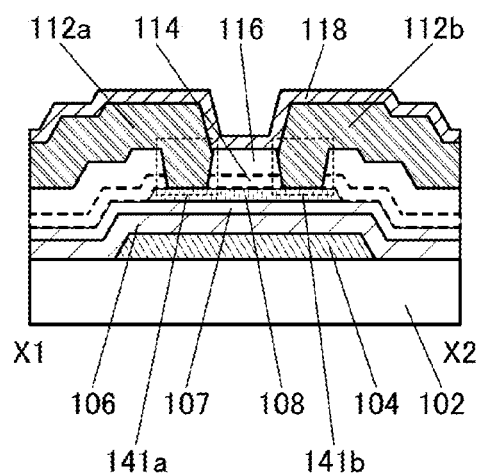
Figure 4C:
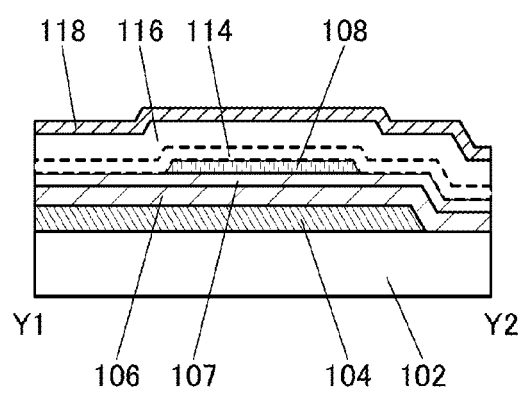

Although the transistor 100 has a channel-etched structure, the transistor 150 in FIGS. 4A to 4C has a channel-protective structure. Thus, either the channel-etched structure or the channel-protective structure can be applied to the semiconductor device of one embodiment of the present invention.

Like the transistor 100, the transistor 150 is provided with the insulating films 114 and 116 over the oxide semiconductor film 108; therefore, oxygen included in the insulating films 114 and 116 can fill oxygen vacancy in the oxide semiconductor film 108.

<Structure Example 3 of Semiconductor Device>

A structure example different from that of the transistor 150 in FIGS. 4A to 4C is described with reference to FIGS. 5A to 5C. Note that in the case where a portion has a function similar to that described above, the same hatch pattern is applied to the portion, and the portion is not especially denoted by a reference numeral in some cases.

Figure 5A:
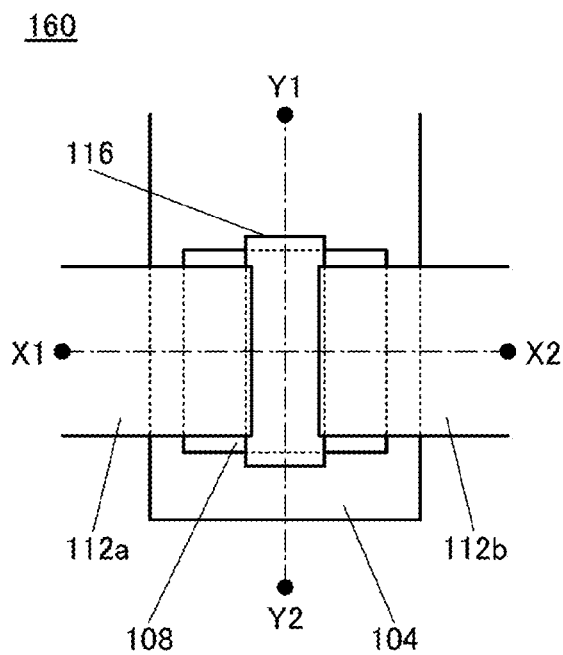
FIGS. 5A to 5C are a top view and cross-sectional views illustrating one embodiment of a semiconductor device.

FIG. 5A is a top view of a transistor 160 that is a semiconductor device of one embodiment of the present invention. FIG. 5B is a cross-sectional view taken along a dashed dotted line X1-X2 in FIG. 5A, and FIG. 5C is a cross-sectional view taken along a dashed dotted line Y1-Y2 in FIG. 5A.

The transistor 160 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112*a* functioning as a source electrode electrically connected to the oxide semiconductor film 108, and the conductive film 112*b* functioning as a drain electrode electrically connected to the oxide semiconductor film 108. Over the transistor 160, specifically, over the conductive films 112*a* and 112*b* and the insulating film 116, the insulating film 118 is provided. The insulating films 114 and 116 function as protective insulating films for the oxide semiconductor film 108. The insulating film 118 functions as a protective insulating film for the transistor 160.

The transistor 160 includes indium in the vicinity of an interface between the insulating film 116 and the insulating film 118.

The transistor 160 is different from the transistor 150 in FIGS. 4A to 4C in the shapes of the insulating films 114 and 116. Specifically, the insulating films 114 and 116 of the transistor 160 have island shapes and are provided over a channel region of the oxide semiconductor film 108. The other components are the same as those of the transistor 150, and the effect similar to that in the case of the transistor 150 is obtained.

<Structure Example 4 of Semiconductor Device>

A structure example different from that of the transistor 100 in FIGS. 1A to 1C is described with reference to FIGS. 6A to 6C. Note that in the case where a portion has a function similar to that described above, the same hatch pattern is applied to the portion, and the portion is not especially denoted by a reference numeral in some cases.

Figure 6A:
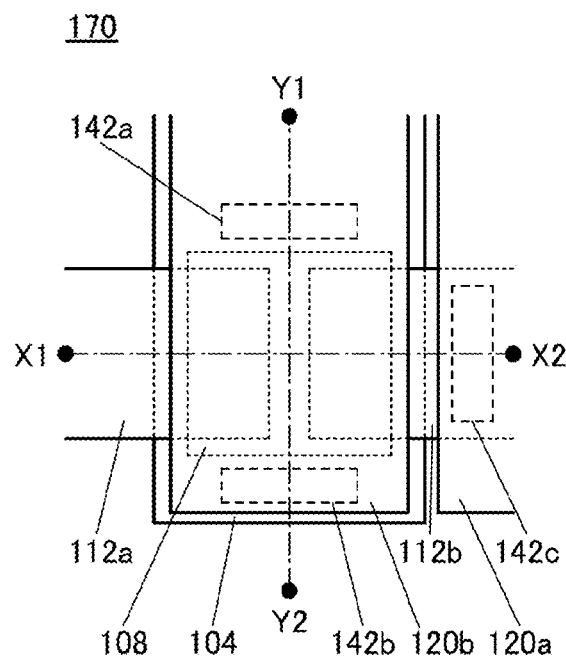
FIGS. 6A to 6C are a top view and cross-sectional views illustrating one embodiment of a semiconductor device.

FIG. 6A is a top view of a transistor 170 that is a semiconductor device of one embodiment of the present invention. FIG. 6B is a cross-sectional view taken along a dashed dotted line X1-X2 in FIG. 6A, and FIG. 6C is a cross-sectional view taken along a dashed dotted line Y1-Y2 in FIG. 6A.

The transistor 170 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112*a* functioning as a source electrode electrically connected to the oxide semiconductor film 108, the conductive film 112*b* functioning as a drain electrode electrically connected to the oxide semiconductor film 108, the insulating film 118 over the conductive films 112*a* and 112*b* and the insulating film 116, and conductive films 120*a* and 120*b* over the insulating film 118.

The transistor 170 includes indium in the vicinity of an interface between the insulating film 116 and the insulating film 118.

The insulating films 114, 116, and 118 in the transistor 170 function as second gate insulating films of the transistor 170. The conductive film 120*a* in the transistor 170 functions as, for example, a pixel electrode used for a display device. The conductive film 120*a* is connected to the conductive film 112*b* through an opening 142*c* provided in the insulating films 114, 116, and 118. The conductive film 120*b* in the transistor 170 functions as a second gate electrode (also referred to as a back gate electrode).

Figure 6B:
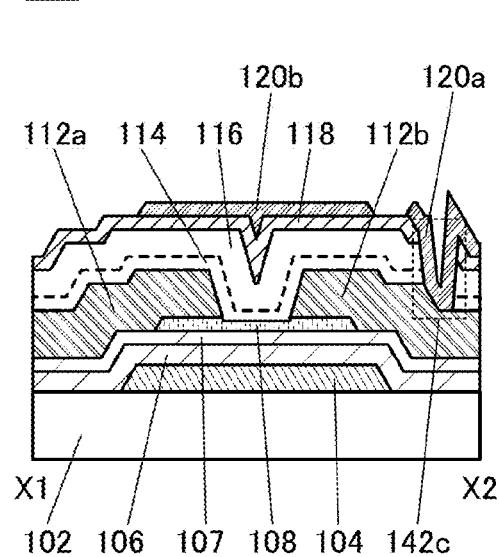
Figure 6C:
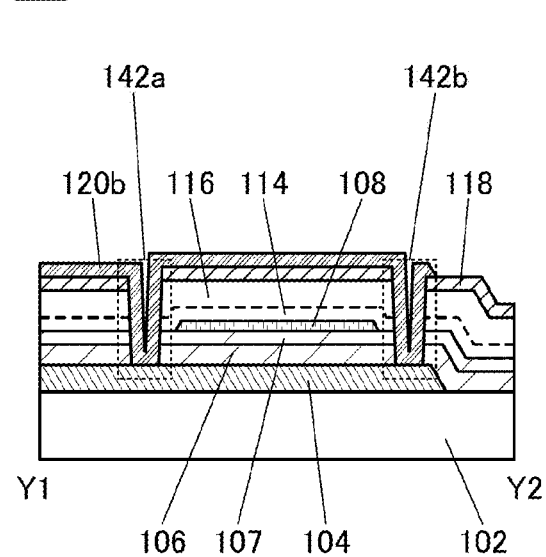

As illustrated in FIG. 6C, the conductive film 120*b* is connected to the conductive film 104 functioning as a first gate electrode through openings 142*a* and 142*b* provided in the insulating films 106, 107, 114, 116, and 118. Accordingly, the conductive film 120*b* and the conductive film 104 are supplied with the same potential.

Note that although the structure in which the openings 142*a* and 142*b* are provided so that the conductive film 120*b* and the conductive film 104 are connected to each other is described in this embodiment, one embodiment of the present invention is not limited thereto. For example, a structure in which only one of the openings 142*a* and 142*b* is provided so that the conductive film 120*b* and the conductive film 104 are connected to each other, or a structure in which the openings 142*a* and 142*b* are not provided and the conductive film 120*b* and the conductive film 104 are not connected to each other may be employed. Note that in the case where the conductive film 120*b* and the conductive film 104 are not connected to each other, it is possible to apply different potentials to the conductive film 120*b* and the conductive film 104.

As illustrated in FIG. 6B, the oxide semiconductor film 108 is positioned to face each of the conductive film 104 functioning as a first gate electrode and the conductive film 120*b* functioning as a second gate electrode, and is sandwiched between the two conductive films functioning as gate electrodes. The lengths in the channel length direction and the channel width direction of the conductive film 120*b* functioning as a second gate electrode are longer than those in the channel length direction and the channel width direction of the oxide semiconductor film 108. The whole oxide semiconductor film 108 is covered with the conductive film 120*b* with the insulating films 114, 116, and 118 positioned therebetween. Since the conductive film 120b functioning as a second gate electrode is connected to the conductive film 104 functioning as a first gate electrode through the opening 142a and 142b provided in the insulating films 106, 107, 114, 116, and 118, a side surface of the oxide semiconductor film 108 in the channel width direction faces the conductive film 120b functioning as a second gate electrode with the insulating films 114, 116, and 118 positioned therebetween.

In other words, in the channel width direction of the transistor 170, the conductive film 104 functioning as a first gate electrode and the conductive film 120b functioning as a second gate electrode are connected to each other through the openings provided in the insulating films 106 and 107 functioning as first gate insulating films, and the insulating films 114, 116, and 118 functioning as second gate insulating films; and the conductive film 104 and the conductive film 120b surround the oxide semiconductor film 108 with the insulating films 106 and 107 functioning as first gate insulating films, and the insulating films 114, 116, and 118 functioning as second gate insulating films positioned therebetween.

Such a structure makes it possible that the oxide semiconductor film 108 included in the transistor 170 is electrically surrounded by electric fields of the conductive film 104 functioning as a first gate electrode and the conductive film 120b functioning as a second gate electrode. A device structure of a transistor, like that of the transistor 170, in which electric fields of a first gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as a first gate electrode; therefore, the current drive capability of the transistor 170 can be improved and high on-state current characteristics can be obtained. Since the on-state current can be increased, it is possible to reduce the size of the transistor 170. In addition, since the transistor 170 is surrounded by the conductive film 104 functioning as a first gate electrode and the conductive film 120b functioning as a second gate electrode, the mechanical strength of the transistor 170 can be increased.

<Structure Example 5 of Semiconductor Device>

Structure examples different from that of the transistor 100 in FIGS. 1A to 1C are described with reference to FIGS. 7A to 7D. Note that in the case where a portion has a function similar to that described above, the same hatch pattern is applied to the portion, and the portion is not especially denoted by a reference numeral in some cases.

Figure 7A:
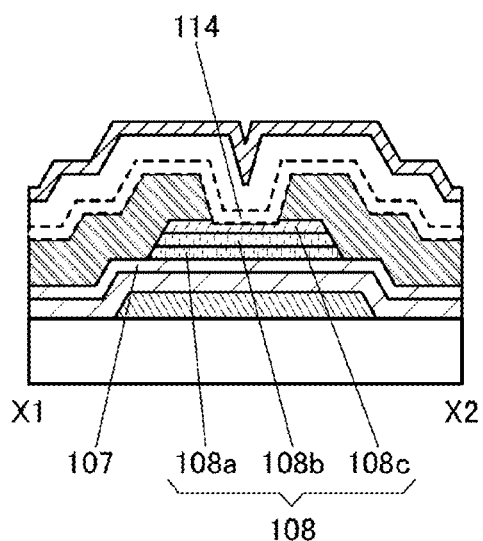
FIGS. 7A to 7D are cross-sectional views illustrating one embodiment of a semiconductor device.
Figure 7B:
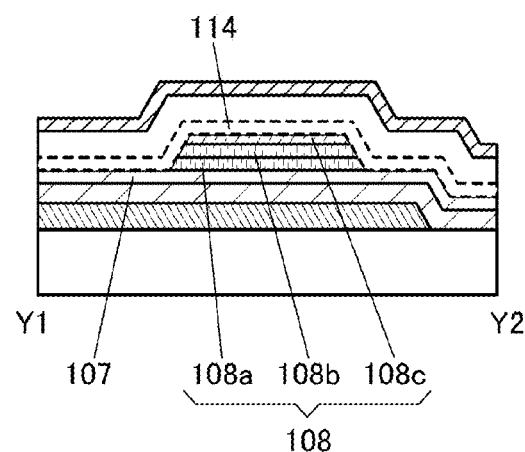
Figure 7C:
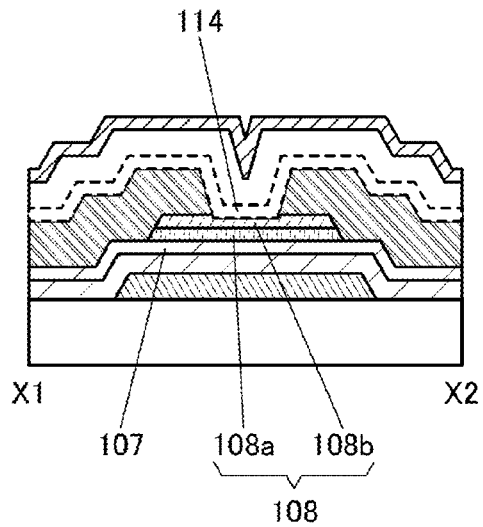
Figure 7D:
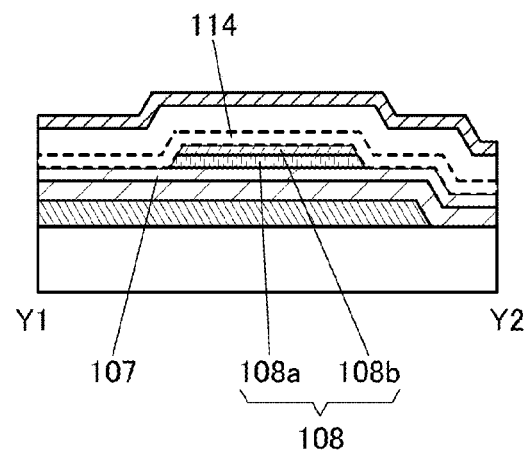

FIGS. 7A and 7B each illustrate a cross-sectional view of a modification example of the transistor 100 in FIGS. 1B and 1C. FIGS. 7C and 7D each illustrate a cross-sectional view of another modification example of the transistor 100 in FIGS. 1B and 1C.

A transistor 100A in FIGS. 7A and 7B has the same structure as the transistor 100 in FIGS. 1B and 1C except that the oxide semiconductor film 108 has a three-layer structure. Specifically, the oxide semiconductor film 108 of the transistor 100A includes an oxide semiconductor film 108a, an oxide semiconductor film 108b, and an oxide semiconductor film 108c.

A transistor 100B in FIGS. 7C and 7D has the same structure as the transistor 100 in FIGS. 1B and 1C except that the oxide semiconductor film 108 has a two-layer structure. Specifically, the oxide semiconductor film 108 of the transistor 100B includes the oxide semiconductor film 108a and the oxide semiconductor film 108b.

Here, a band structure including the oxide semiconductor films 108a, 108b, and 108c and insulating films in contact with the oxide semiconductor films 108b and 108c is described with reference to FIGS. 8A and 8B.

Figure 8A:
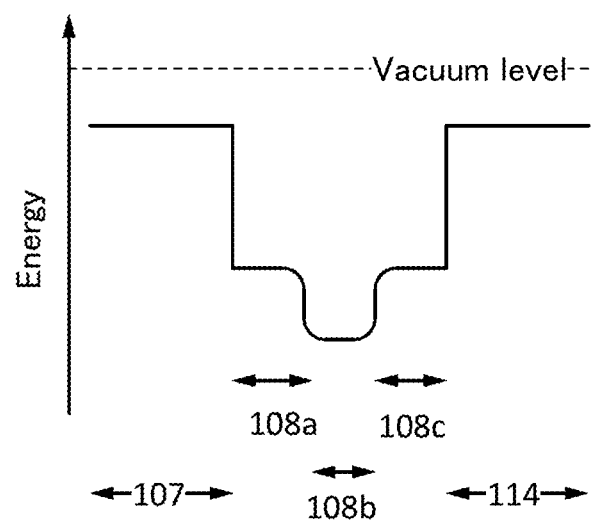
FIGS. 8A and 8B are band diagrams.

FIG. 8A shows an example of a band structure in the thickness direction of a stack including the insulating film 107, the oxide semiconductor films 108a, 108b, and 108c, and the insulating film 114. FIG. 8B shows an example of a band structure in the thickness direction of a stack including the insulating film 107, the oxide semiconductor films 108b and 108c, and the insulating film 114. For easy understanding, energy level of the conduction band minimum (Ec) of each of the insulating film 107, the oxide semiconductor films 108a, 108b, and 108c, and the insulating film 114 is shown in the band structures.

In the band structure of FIG. 8A, a silicon oxide film is used as each of the insulating films 107 and 114, an oxide semiconductor film formed using a metal oxide target having an atomic ratio of metal elements of In:Ga:Zn=1:3:2 is used as the oxide semiconductor film 108a, an oxide semiconductor film formed using a metal oxide target having an atomic ratio of metal elements of In:Ga:Zn=1:1:1 is used as the oxide semiconductor film 108b, and an oxide semiconductor film formed using a metal oxide target having an atomic ratio of metal elements of In:Ga:Zn=1:3:2 is used as the oxide semiconductor film 108c.

Figure 8B:
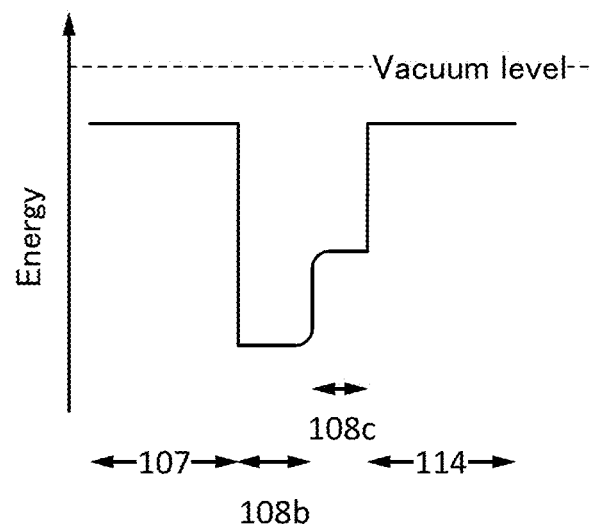

In the band structure of FIG. 8B, a silicon oxide film is used as each of the insulating films 107 and 114, an oxide semiconductor film formed using a metal oxide target having an atomic ratio of metal elements of In:Ga:Zn=1:1:1 is used as the oxide semiconductor film 108b, and an oxide semiconductor film formed using a metal oxide target having an atomic ratio of metal elements of In:Ga:Zn=1:3:2 is used as the oxide semiconductor film 108c.

As illustrated in FIGS. 8A and 8B, the energy level of the conduction band minimum gradually varies between the oxide semiconductor film 108a and the oxide semiconductor film 108b and between the oxide semiconductor film 108b and the oxide semiconductor film 108c. In other words, the energy level of the conduction band minimum is continuously varied or continuously connected. To obtain such a band structure, there exists no impurity, which forms a defect state such as a trap center or a recombination center, at the interface between the oxide semiconductor film 108a and the oxide semiconductor film 108b or at the interface between the oxide semiconductor film 108b and the oxide semiconductor film 108c.

To form a continuous junction between the oxide semiconductor film 108a and the oxide semiconductor film 108b and between the oxide semiconductor film 108b and the oxide semiconductor film 108c, it is necessary to form the films successively without exposure to the air by using a multi-chamber deposition apparatus (sputtering apparatus) provided with a load lock chamber.

With the band structure of FIG. 8A or FIG. 8B, the oxide semiconductor film 108b serves as a well, and a channel region is formed in the oxide semiconductor film 108b in the transistor with the stacked-layer structure.

Note that at an interface between the oxide semiconductor film and the insulating film or in the vicinity of the interface, trap states due to impurities or defects might be formed. By providing the oxide semiconductor film 108a and/or the oxide semiconductor film 108c, the trap states can be distanced away from the oxide semiconductor film 108b where a channel region is formed.

In addition, in the case where the energy level of the trap state is lower than the energy level of the conduction band minimum (Ec) of the oxide semiconductor film 108b, electrons are likely to be accumulated in the trap state. When the electrons are accumulated in the trap state, the electrons become negative fixed electric charge, so that the threshold voltage of the transistor is shifted in the positive direction. Therefore, it is preferable that the energy level of the trap state be higher than the energy level of the conduction band minimum (Ec) of the oxide semiconductor film 108b. Such a structure inhibits accumulation of electrons in the trap states. As a result, the on-state current and the field-effect mobility of the transistor can be increased.

In FIGS. 8A and 8B, the energy level of the conduction band minimum of each of the oxide semiconductor films 108a and 108c is closer to the vacuum level than that of the oxide semiconductor film 108b. Typically, a difference in energy level between the conduction band minimum of the oxide semiconductor film 108b and the conduction band minimum of each of the oxide semiconductor films 108a and 108c is 0.15 eV or more or 0.5 eV or more and 2 eV less or 1 eV or less. That is, the difference between the electron affinity of each of the oxide semiconductor films 108a and 108c and the electron affinity of the oxide semiconductor film 108b is 0.15 eV or more or 0.5 eV or more and 2 eV or less or 1 eV or less.

In such a structure, the oxide semiconductor film 108b serves as a main path of current and functions as a channel region. In addition, since the oxide semiconductor films 108a and 108c each include one or more metal elements included in the oxide semiconductor film 108b in which a channel region is formed, interface scattering is less likely to occur at the interface between the oxide semiconductor film 108a and the oxide semiconductor film 108b or at the interface between the oxide semiconductor film 108b and the oxide semiconductor film 108c. Thus, the transistor can have high field-effect mobility because the movement of carriers is not hindered at the interface.

To prevent each of the oxide semiconductor films 108a and 108c from functioning as part of a channel region, a material having sufficiently low conductivity is used for the oxide semiconductor films 108a and 108c. Alternatively, a material which has a smaller electron affinity (a difference in energy level between the vacuum level and the conduction band minimum) than the oxide semiconductor film 108b and has a difference in energy level in the conduction band minimum from the oxide semiconductor film 108b (band offset) is used for the oxide semiconductor films 108a and 108c. Furthermore, to inhibit generation of a difference between threshold voltages due to the value of the drain voltage, it is preferable to form the oxide semiconductor films 108a and 108c using a material whose energy level of the conduction band minimum is closer to the vacuum level than that of the oxide semiconductor film 108b by 0.2 eV or more, preferably 0.5 eV or more.

It is preferable that the oxide semiconductor films 108a and 108c not have a spinel crystal structure. This is because if the oxide semiconductor films 108a and 108c have a spinel crystal structure, constituent elements of the conductive films 112a and 112b might be diffused to the oxide semiconductor film 108b at the interface between the spinel crystal structure and another region. Note that each of the oxide semiconductor film 108a and 108c is preferably a CAAC-OS, which is described later, in which case a higher blocking property against constituent elements of the conductive films 112a and 112b, for example, copper elements, is obtained.

The thickness of each of the oxide semiconductor films 108a and 108c is greater than or equal to a thickness that is capable of inhibiting diffusion of the constituent elements of the conductive films 112a and 112b to the oxide semiconductor film 108b, and less than a thickness that inhibits supply of oxygen from the insulating film 114 to the oxide semiconductor film 108b. For example, when the thickness of each of the oxide semiconductor films 108a and 108c is greater than or equal to 10 nm, diffusion of the constituent elements of the conductive films 112a and 112b to the oxide semiconductor film 108b can be inhibited. When the thickness of each of the oxide semiconductor films 108a and 108c is less than or equal to 100 nm, oxygen can be effectively supplied from the insulating films 114 and 116 to the oxide semiconductor film 108b.

When the oxide semiconductor films 108a and 108c are each an In-M-Zn oxide in which the atomic ratio of the element M (M is Ti, Ga, Sn, Y, Zr, La, Ce, Nd, or Hf) is higher than that of In, the energy gap of each of the oxide semiconductor films 108a and 108c can be large and the electron affinity thereof can be small. Therefore, a difference in electron affinity between the oxide semiconductor film 108b and each of the oxide semiconductor films 108a and 108c may be controlled by the proportion of the element M. Furthermore, oxygen vacancy is less likely to be generated in the oxide semiconductor film in which the atomic ratio of Ti, Ga, Sn, Y, Zr, La, Ce, Nd, or Hf is higher than that of In because Ti, Ga, Sn, Y, Zr, La, Ce, Nd, and Hf each are a metal element that is strongly bonded to oxygen.

When an In-M-Zn oxide is used for the oxide semiconductor films 108a and 108c, the proportions of In and M, not taking Zn and O into consideration, is as follows: the atomic percentage of In is preferably less than 50 atomic % and the atomic percentage of M is greater than 50 atomic % and further preferably the atomic percentage of In is less than 25 atomic % and the atomic percentage of M is greater than 75 atomic %. Alternatively, a gallium oxide film may be used as each of the oxide semiconductor films 108a and 108c.

Furthermore, in the case where each of the oxide semiconductor films 108a, 108b, and 108c is an In-M-Zn oxide, the proportion of M atoms in each of the oxide semiconductor films 108a and 108c is higher than that in the oxide semiconductor film 108b. Typically, the proportion of M atoms in each of the oxide semiconductor films 108a and 108c is 1.5 or more times, preferably two or more times and further preferably three or more times as high as that in the oxide semiconductor film 108b.

Furthermore, in the case where the oxide semiconductor films 108a, 108b, and 108c are each an In-M-Zn oxide, when the oxide semiconductor film 108b has an atomic ratio of In:M:Zn=$x_1$:$y_1$:$z_1$ and the oxide semiconductor films 108a and 108c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, and still further preferably $y_2/x_2$ is three or more times or four or more times as large as $y_1/x_1$. At this time, $y_1$ is preferably greater than or equal to $x_1$ in the oxide semiconductor film 108b, because stable electrical characteristics of a transistor including the oxide semiconductor film 108b can be achieved. However, when $y_1$ is three or more times as large as $x_1$, the field-effect mobility of the transistor including the oxide semiconductor film 108b is reduced. Accordingly, $y_1$ is preferably smaller than three times $x_1$.

In the case where the oxide semiconductor film 108b is an In-M-Zn oxide and a target having the atomic ratio of metal elements of In:M:Zn=$x_1$:$y_1$:$z_1$ is used for depositing the oxide semiconductor film 108b, $x_1/y_1$ is preferably greater than or equal to ⅓ and less than or equal to 6 and further preferably greater than or equal to 1 and less than or equal to 6, and $z_1/y_1$ is preferably greater than or equal to ⅓ and less than or equal to 6 and further preferably greater than or equal to 1 and less than or equal to 6. Note that when $z_1/y_1$ is greater than or equal to 1 and less than or equal to 6, a CAAC-OS to be described later is easily formed as the oxide semiconductor film 108b. Typical examples of the atomic ratio of the metal elements of the target are In:M:Zn=1:1:1, In:M:Zn=1:1:1.2, and In:M:Zn=3:1:2.

In the case where the oxide semiconductor films 108a and 108c are each an In-M-Zn oxide and a target having an atomic ratio of metal elements of In:M:Zn=$x_2$:$y_2$:$z_2$ is used for depositing the oxide semiconductor films 108a and 108c, $x_2/y_2$ is preferably less than $x_1/y_1$, and $z_2/y_2$ is preferably greater than or equal to ⅓ and less than or equal to 6 and further preferably greater than or equal to 1 and less than or equal to 6. When the atomic ratio of M with respect to indium is high, the energy gap of the oxide semiconductor films 108a and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 108a and 108c are each an In-M oxide, when a divalent metal element (e.g., zinc) is not included as M, the oxide semiconductor films 108a and 108c which do not include a spinel crystal structure can be formed. As the oxide semiconductor films 108a and 108c, for example, an In—Ga oxide film can be used. The In—Ga oxide film can be formed by a sputtering method using an In—Ga metal oxide target (In:Ga=7:93), for example. To deposit the oxide semiconductor films 108a and 108c by a sputtering method using DC discharge, on the assumption that an atomic ratio of In:M is x:y, y/(x+y) is preferably less than or equal to 0.96 and further preferably less than or equal to 0.95, for example, 0.93.

In each of the oxide semiconductor films 108a, 108b, and 108c, the proportions of the atoms in the above atomic ratio vary within a range of ±40% as an error.

The structures of the transistors of this embodiment can be freely combined with each other.

<Method 1 for Manufacturing Semiconductor Device>

Next, a method for manufacturing the transistor 100 in FIGS. 1A to 1C that is a semiconductor device of one embodiment of the present invention is described in detail below with reference to FIGS. 9A to 9D and FIGS. 10A to 10D.

Note that the films included in the transistor 100 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a PECVD method are typical examples of the film formation method, a thermal CVD method may be used. As the thermal CVD method, an MOCVD method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by an ALD method is performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

First, a conductive film is formed over the substrate 102 and processed through a lithography process and an etching process, whereby the conductive film 104 functioning as a first gate electrode is formed. Then, the insulating films 106 and 107 functioning as first gate insulating films are formed over the conductive film 104 (see FIG. 9A).

The conductive film 104 functioning as a first gate electrode can be formed by a sputtering method, a CVD method, a vacuum evaporation method, or a PLD method. Alternatively, a coating method or a printing method can be used. Although typical deposition methods are a sputtering method and a PECVD method, a thermal CVD method, such as an MOCVD method, or an ALD method described above may be used.

In this embodiment, a glass substrate is used as the substrate 102, and as the conductive film 104 functioning as a first gate electrode, a 100-nm-thick tungsten film is formed by a sputtering method.

The insulating films 106 and 107 functioning as first gate insulating films can be formed by a sputtering method, a PECVD method, a thermal CVD method, a vacuum evaporation method, a PLD method, or the like. In this embodiment, a 400-nm-thick silicon nitride film as the insulating film 106 and a 50-nm-thick silicon oxynitride film as the insulating film 107 are formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C.

When the insulating film 106 has the three-layer structure of silicon nitride films, for example, in the case where a conductive film including Cu is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film including oxygen to improve characteristics of an interface with the oxide semiconductor film 108 formed later.

Figure 9A:
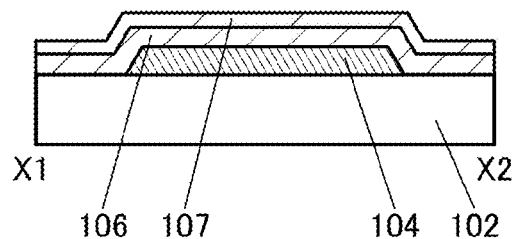
FIGS. 9A to 9D are cross-sectional views illustrating an example of a manufacturing process of a semiconductor device.
Figure 9B:
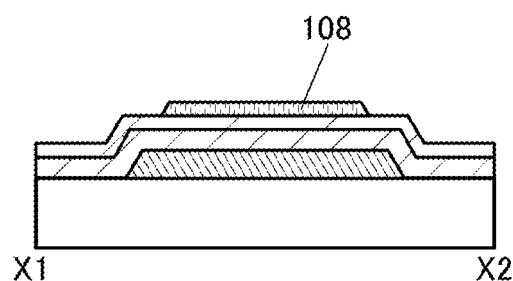

Next, the oxide semiconductor film 108 is formed over the insulating film 107 (see FIG. 9B).

In this embodiment, an oxide semiconductor film is formed by a sputtering method using an In—Ga—Zn metal oxide target (having an atomic ratio of In:Ga:Zn=1:1:1.2), a mask is formed over the oxide semiconductor film through a lithography process, and the oxide semiconductor film is processed into a desired shape, whereby the oxide semiconductor film 108 having an island shape is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C. and further preferably higher than or equal to 300° C. and lower than or equal to 450° C. The heat treatment performed here serves as one kind of treatment for increasing the purity of the oxide semiconductor film and can reduce hydrogen, water, and the like included in the oxide semiconductor film 108. Note that the heat treatment for the purpose of reducing hydrogen, water, and the like may be performed before the oxide semiconductor film 108 is processed into an island shape.

An electric furnace, an RTA apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor film 108 may be performed under an atmosphere of nitrogen, oxygen, ultra-dry air (air in which a water content is 20 ppm or less, preferably 1 ppm or less and further preferably 10 ppb or less), or a rare gas (argon, helium, or the like). The atmosphere of nitrogen, oxygen, ultra-dry air, or a rare gas preferably does not contain hydrogen, water, and the like. Furthermore, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancy in the oxide semiconductor film can be reduced.

In the case where the oxide semiconductor film 108 is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture and the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas including carbon or hydrogen, from an exhaust system to the inside of the chamber.

Figure 9C:
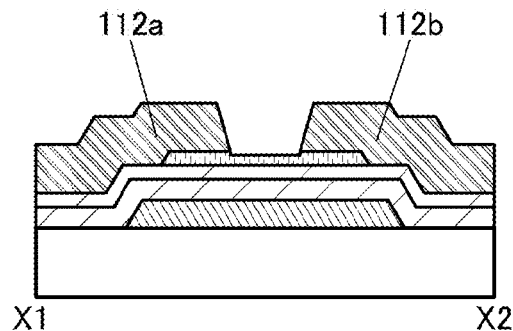

Next, the conductive films 112a and 112b functioning as source and drain electrodes are formed over the insulating film 107 and the oxide semiconductor film 108 (see FIG. 9C).

In this embodiment, the conductive films 112a and 112b are formed in the following manner: a stack of a 50-nm-thick tungsten film and a 400-nm-thick aluminum film is formed by a sputtering method, a mask is formed over the stack through a lithography process, and the stack is processed into desired shapes. Although the conductive films 112a and 112b each have a two-layer structure in this embodiment, one embodiment of the present invention is not limited thereto. For example, the conductive films 112a and 112b each may have a three-layer structure of a 50-nm-thick tungsten film, a 400-nm-thick aluminum film, and a 100-nm-thick titanium film.

After the conductive films 112a and 112b are formed, a surface of the oxide semiconductor film 108 (on a back channel side) may be cleaned. The cleaning may be performed, for example, using a chemical solution such as phosphoric acid. The cleaning using a chemical solution such as a phosphoric acid can remove impurities (e.g., an element included in the conductive films 112a and 112b) attached to the surface of the oxide semiconductor film 108.

Note that a recessed portion might be formed in part of the oxide semiconductor film 108 at the step of forming the conductive films 112a and 112b and/or the cleaning step.

Through the above process, the transistor 100 is manufactured.

Figure 9D:
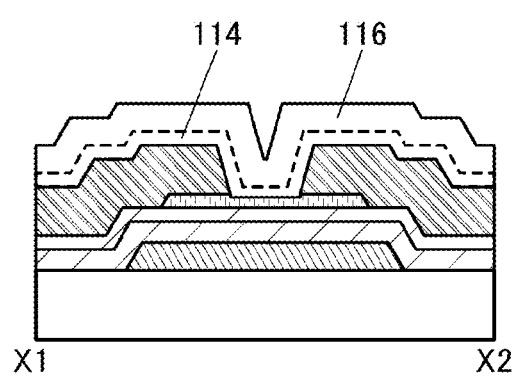

Next, over the transistor 100, specifically, over the oxide semiconductor film 108 and the conductive films 112a and 112b of the transistor 100, the insulating films 114 and 116 functioning as protective insulating films of the transistor 100 are formed (see FIG. 9D).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced, and oxygen in the insulating films 114 and 116 can be moved to the oxide semiconductor film 108; accordingly, the amount of oxygen vacancy in the oxide semiconductor film 108 can be reduced.

For example, as the insulating film 114, a silicon oxynitride film can be formed by a PECVD method. In this case, a deposition gas including silicon and an oxidizing gas are preferably used as a source gas. Typical examples of the deposition gas including silicon include silane, disilane, trisilane, and silane fluoride. Examples of the oxidizing gas include dinitrogen monoxide and nitrogen dioxide. An insulating film including nitrogen and having a small number of defects can be formed as the insulating film 114 by a PECVD method under the conditions where the ratio of the oxidizing gas to the deposition gas is higher than 20 times and lower than 100 times, preferably higher than or equal to 40 times and lower than or equal to 80 times, and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the conditions where the substrate placed in a treatment chamber of the PECVD apparatus, which is vacuum-evacuated, is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa, with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$, is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, an oxide insulating film which includes oxygen in excess of that in the stoichiometric composition and from which part of oxygen is released by heating can be formed.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas including silicon with respect to the oxidizing gas is increased, the number of defects in the insulating film 116 can be reduced. Typically, it is possible to form an oxide insulating layer in which the number of defects is small, that is, the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, and further preferably lower than or equal to $1.5 \times 10^{17}$ spins/cm$^3$, by ESR measurement. As a result, the reliability of the transistor can be improved.

Heat treatment may be performed after the insulating films 114 and 116 are formed. The heat treatment can reduce nitrogen oxide included in the insulating films 114 and 116. By the heat treatment, part of oxygen included in the insulating films 114 and 116 can be moved to the oxide semiconductor film 108, so that the amount of oxygen vacancy included in the oxide semiconductor film 108 can be reduced.

The temperature of the heat treatment performed on the insulating films 114 and 116 is typically higher than or equal to 150° C. and lower than or equal to 400° C., preferably higher than or equal to 300° C. and lower than or equal to 400° C., and further preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less and further preferably 10 ppb or less), or a rare gas (argon, helium, and the like). Note that an electric furnace, an RTA apparatus, or the like can be used for the heat treatment, in which it is preferable that hydrogen, water, and the like not be included in the nitrogen, oxygen, ultra-dry air, or rare gas.

In this embodiment, the heat treatment is performed at 350° C. in an atmosphere of nitrogen and oxygen for 1 hour.

Figure 10A:
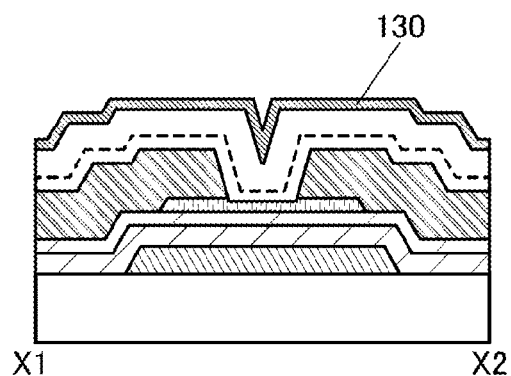
FIGS. 10A to 10D are cross-sectional views illustrating an example of a manufacturing process of a semiconductor device.

Next, a film 130 having a function of inhibiting release of oxygen is formed over the insulating film 116 (see FIG. 10A).

The film 130 having a function of inhibiting release of oxygen can be formed using a conductive film including indium or a semiconductor film including indium.

In this embodiment, as the film 130 having a function of inhibiting release of oxygen, a 5-nm-thick ITSO film is formed with a sputtering apparatus. Note that the thickness of the film 130 is preferably greater than or equal to 1 nm and less than or equal to 20 nm or greater than or equal to 2 nm or less than or equal to 10 nm, in which case oxygen is favorably transmitted and release of oxygen can be inhibited.

Figure 10B:
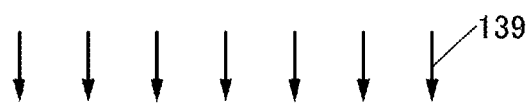
Figure 10B:
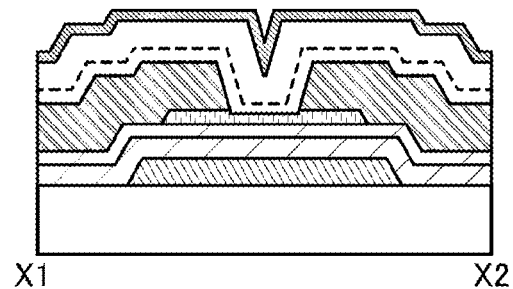

Next, oxygen 139 is added to the insulating films 114 and 116 and the oxide semiconductor film 108 through the film 130 (see FIG. 10B).

As a method for adding the oxygen 139 to the insulating films 114 and 116 and the oxide semiconductor film 108 through the film 130, an ion doping method, an ion implantation method, plasma treatment, or the like is given.

By application of bias voltage to the substrate side when the oxygen 139 is added, the oxygen 139 can be effectively added to the insulating films 114 and 116 and the oxide semiconductor film 108. An ashing apparatus is used, for example, and power density of the bias voltage applied to a substrate side of the ashing apparatus can be greater than or equal to 1 W/cm$^2$ and less than or equal to 5 W/cm$^2$ as the bias voltage. The substrate temperature during addition of the oxygen 139 is higher than or equal to room temperature and lower than or equal to 300° C., preferably higher than or equal to 100° C. and lower than or equal to 250° C., whereby the oxygen can be added efficiently to the insulating films 114 and 116.

When the film 130 is provided over the insulating film 116 and then oxygen is added, the film 130 functions as a protective film for inhibiting release of oxygen from the insulating film 116. Thus, a larger amount of oxygen can be added to the insulating films 114 and 116 and the oxide semiconductor film 108.

In the case where oxygen is introduced by plasma treatment, by making oxygen excited by a microwave to generate high density oxygen plasma, the amount of oxygen introduced into the insulating film 116 can be increased.

Figure 10C:
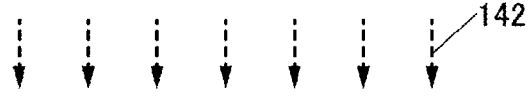
Figure 10C:
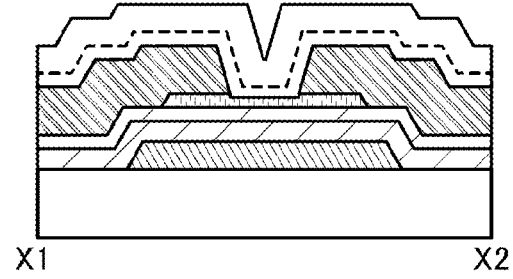

Next, the film 130 having a function of inhibiting release of oxygen is removed using an etchant 142 (see FIG. 10C).

As the etchant 142, a chemical solution or an etching gas that can remove the film 130 having a function of inhibiting release of oxygen is used. In this embodiment, an oxalic acid solution at a concentration of 5% is used as the etchant 142. As the etchant 142, after the oxalic acid solution at a concentration of 5% is used, hydrofluoric acid at a concentration of 0.5% may be used. With the use of the hydrofluoric acid at a concentration of 0.5%, the film having a function of inhibiting release of oxygen can be favorably removed.

Figure 10D:
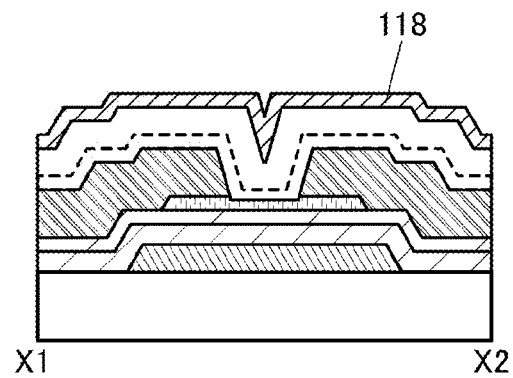

Next, the insulating film 118 is formed over the insulating film 116, whereby the transistor 100 in FIGS. 1A to 1C is formed (see FIG. 10D).

In the case where the insulating film 118 is formed by a PECVD method, the substrate temperature is set to be higher than or equal to 300° C. and lower than or equal to 400° C., preferably higher than or equal to 320° C. and lower than or equal to 370° C., so that a dense film can be formed.

For example, in the case where a silicon nitride film is formed by a PECVD method as the insulating film 118, a deposition gas including silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas including silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Note that heat treatment may be performed before or after the formation of the insulating film 118, so that excess oxygen included in the insulating films 114 and 116 can be diffused to the oxide semiconductor film 108 to fill oxygen vacancy in the oxide semiconductor film 108. Alternatively, the insulating film 118 may be deposited by heating, so that excess oxygen included in the insulating films 114 and 116 can be diffused to the oxide semiconductor film 108 to fill oxygen vacancy in the oxide semiconductor film 108. The temperature of the heat treatment that can be performed before or after the formation of the insulating film 118 is typically higher than or equal to 150° C. and lower than or equal to 400° C., preferably higher than or equal to 300° C. and lower than or equal to 400° C. and further preferably higher than or equal to 320° C. and lower than or equal to 370° C.

Through the above process, the transistor 100 in FIGS. 1A to 1C can be manufactured.

<Method 2 for Manufacturing Semiconductor Device>

Next, a method for manufacturing the transistor 150 in FIGS. 4A to 4C that is a semiconductor device of one embodiment of the present invention is described in detail below with reference to FIGS. 11A to 11D and FIGS. 12A and 12B.

Figure 11A:
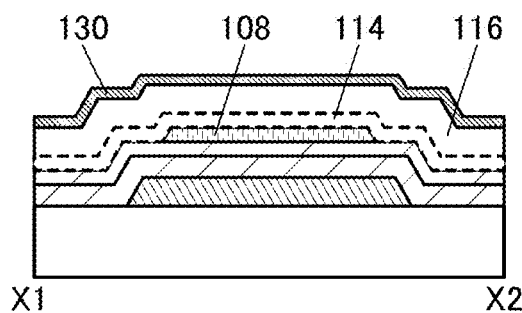
FIGS. 11A to 11D are cross-sectional views illustrating an example of a manufacturing process of a semiconductor device.

First, the steps up to the step in FIG. 9B are performed, and then the insulating films 114 and 116 and the film 130 having a function of inhibiting release of oxygen are formed over the insulating film 107 and the oxide semiconductor film 108 (see FIG. 11A).

Figure 11B:
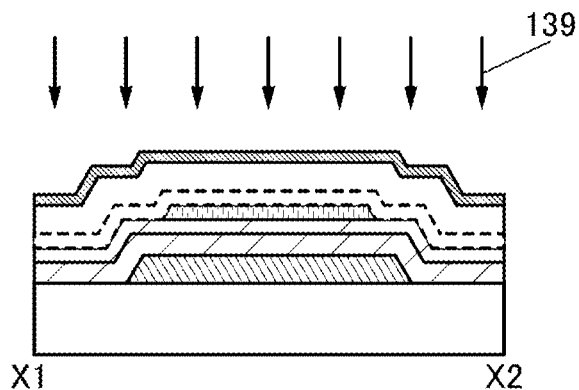

Next, oxygen 139 is added to the insulating films 114 and 116 and the oxide semiconductor film 108 through the film 130 having a function of inhibiting release of oxygen (see FIG. 11B).

Figure 11C:
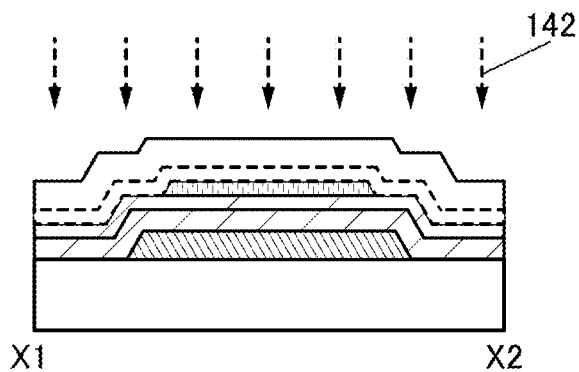
Figure 11D:
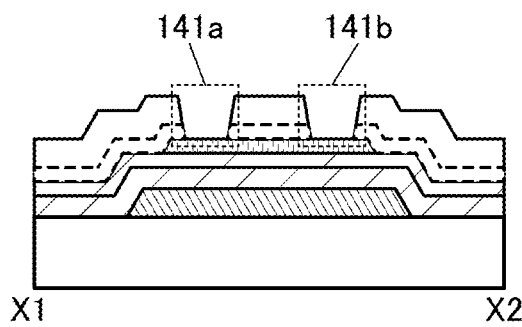

Next, the film 130 having a function of inhibiting release of oxygen is removed using the etchant 142 (see FIG. 11C).

Next, a mask is formed over the insulating film 116 through a lithography process, and the openings 141$a$ and 141$b$ are formed in desired regions in the insulating films 114 and 116. Note that the openings 141$a$ and 141$b$ reach the oxide semiconductor film 108 (see FIG. 11D).

Figure 12A:
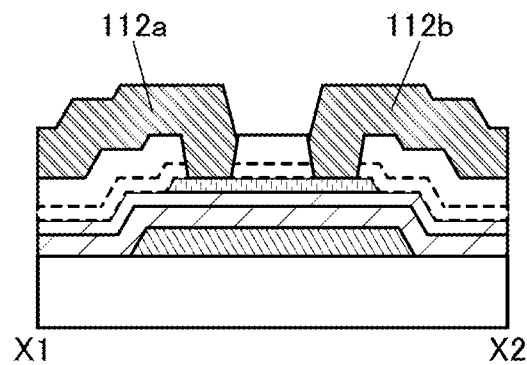
FIGS. 12A and 12B are cross-sectional views illustrating an example of a manufacturing process of a semiconductor device.

Next, a conductive film is formed over the oxide semiconductor film 108 and the insulating film 116 to cover the openings 141$a$ and 141$b$, a mask is formed over the conductive film through a lithography process, and the conductive film is processed into desired shapes, whereby the conductive films 112$a$ and 112$b$ are formed (see FIG. 12A).

Figure 12B:
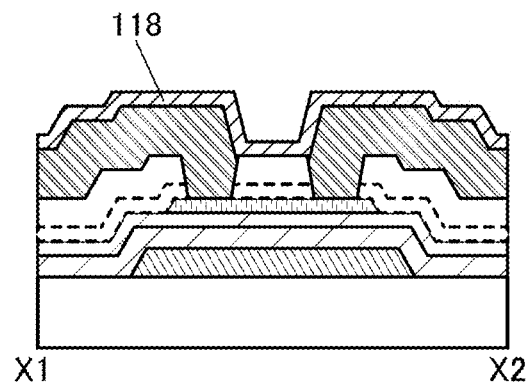

Next, the insulating film 118 is formed over the insulating film 116 and the conductive films 112$a$ and 112$b$ (see FIG. 12B).

Through the above process, the transistor 150 in FIGS. 4A to 4C can be manufactured.

Figure 5B:
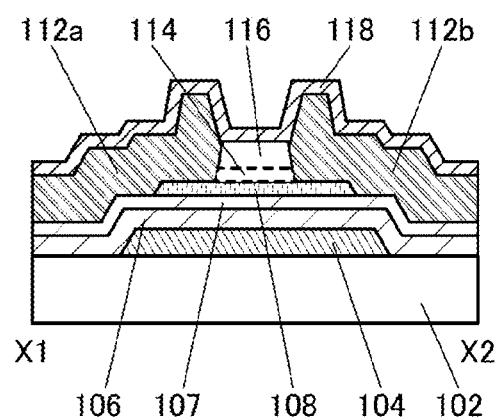
Figure 5C:
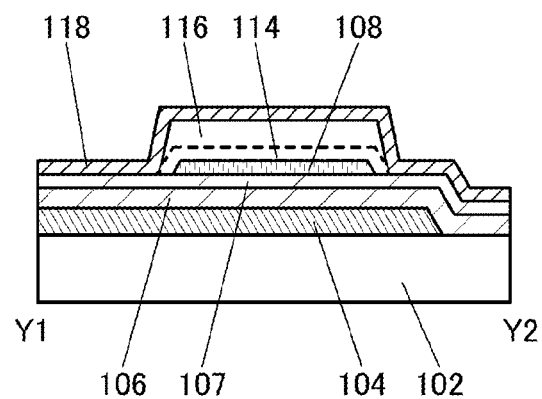

Note that the transistor 160 in FIGS. 5A to 5C can be manufactured in such a manner that the insulating films 114 and 116 are left over a channel region of the oxide semiconductor film 108 at the formation of the openings 141*a* and 141*b*.

<Method 3 for Manufacturing Semiconductor Device>

Next, a method for manufacturing the transistor 170 in FIGS. 6A to 6C that is a semiconductor device of one embodiment of the present invention is described in detail below with reference to FIGS. 13A to 13D and FIGS. 14A to 14D.

FIGS. 13A and 13C and FIGS. 14A and 14C are each a cross-sectional view in the channel length direction of the transistor 170 in the manufacturing process, and FIGS. 13B and 13D and FIGS. 14B and 14D are each a cross-sectional view in the channel width direction of the transistor 170 in the manufacturing process.

Figure 13A:
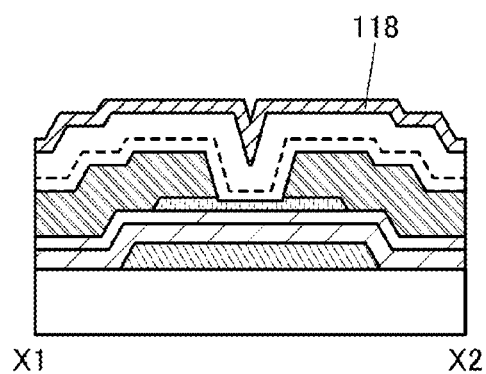
FIGS. 13A to 13D are cross-sectional views illustrating an example of a manufacturing process of a semiconductor device.
Figure 13B:
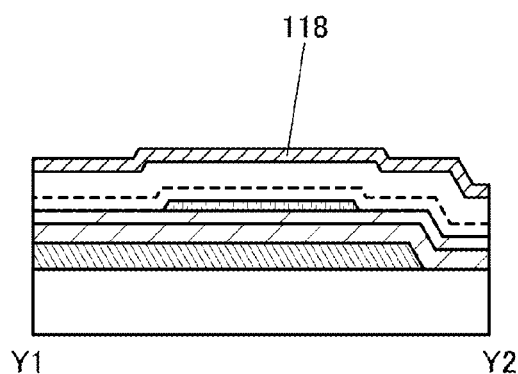
Figure 13C:
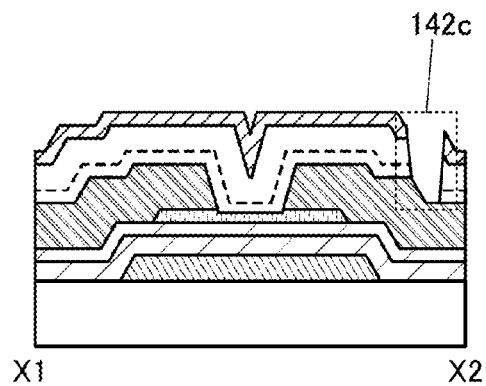
Figure 13D:
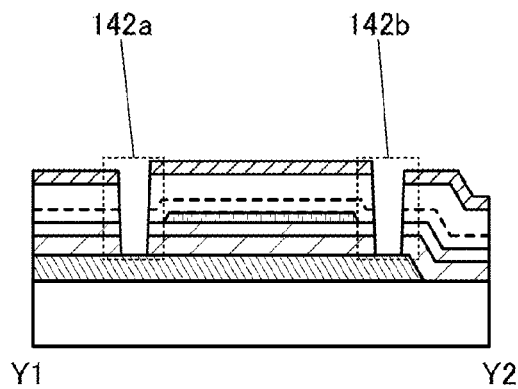

First, the steps up to the step in FIG. 10D are performed (see FIGS. 13A and 13B).

Next, a mask is formed over the insulating film 118 through a lithography process, and the opening 142*c* is formed in a desired region in the insulating films 114, 116, and 118. In addition, a mask is formed over the insulating film 118 through a lithography process, and the openings 142*a* and 142*b* are formed in desired regions in the insulating films 106, 107, 114, 116, and 118. Note that the opening 142*c* reaches the conductive film 112*b*. The openings 142*a* and 142*b* reach the conductive film 104 (see FIGS. 13C and 13D).

Note that the openings 142*a* and 142*b* and the opening 142*c* may be formed at a time or may be formed by different steps. In the case where the openings 142*a* and 142*b* and the opening 142*c* are formed at a time, for example, a gray-tone mask or a half-tone mask can be used.

Figure 14A:
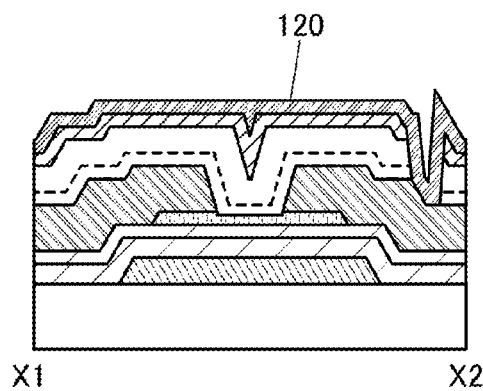
FIGS. 14A to 14D are cross-sectional views illustrating an example of a manufacturing process of a semiconductor device.
Figure 14B:
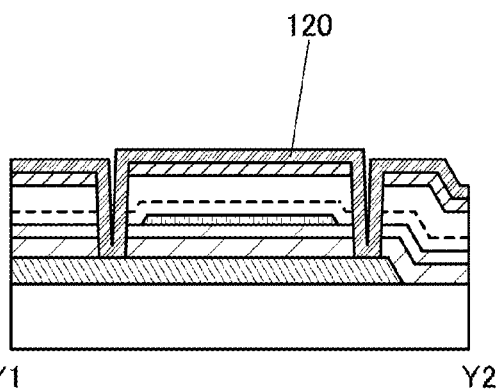

Next, a conductive film 120 is formed over the insulating film 118 to cover the openings 142*a*, 142*b*, and 142*c* (see FIGS. 14A and 14B).

For the conductive film 120, for example, a material including one of indium (In), zinc (Zn), and tin (Sn) can be used. In particular, for the conductive film 120, a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide including silicon oxide can be used. Moreover, the conductive film 120 is favorably formed using the same kind of material as the film 130 having a function of inhibiting release of oxygen, in which case the manufacturing cost can be reduced.

The conductive film 120 can be formed by a sputtering method, for example. In this embodiment, a 110-nm-thick ITSO film is formed by a sputtering method.

Figure 14C:
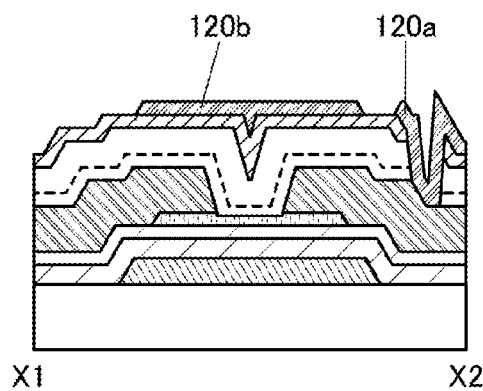
Figure 14D:
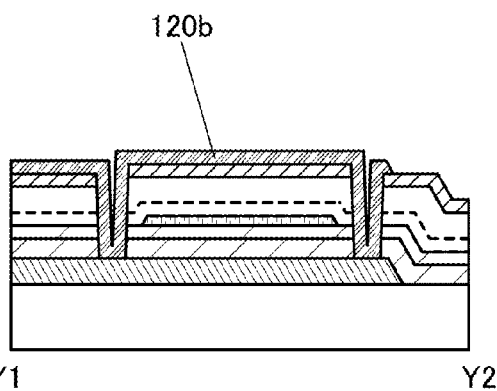

Next, a mask is formed over the conductive film 120 through a lithography process, and the conductive film 120 is processed into desired shapes to form the conductive films 120*a* and 120*b* (see FIGS. 14C and 14D).

Through the above process, the transistor 170 in FIGS. 6A to 6C can be manufactured.

The structure and method described in this embodiment can be implemented in appropriate combination with any of the structures and methods described in the other embodiments.

[Embodiment 2]

In this embodiment, the structure of an oxide semiconductor film included in a semiconductor device of one embodiment of the present invention will be described below in detail.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, a boundary between crystal parts, that is, a grain boundary is not clearly observed even in the high-resolution TEM image. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology that reflects a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2 θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2 θ may also be observed at around 36°, in addition to the peak of 2 θ at around 31°. The peak of 2 θ at around 36° indicates that a crystal having no c-axis alignment is included in part of the CAAC-OS film. It is preferable that in the CAAC-OS film, a peak of 2 θ appear at around 31° and a peak of 2 θ not appear at around 36°.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. In addition, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might function as a carrier trap or a carrier generation source.

The CAAC-OS film is an oxide semiconductor film having a low density of defect states. In some cases, oxygen vacancies in the oxide semiconductor film function as carrier traps or function as carrier generation sources when hydrogen is captured therein.

The state in which the impurity concentration is low and the density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having a high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film observed with a high-resolution TEM, for example, a grain boundary is not easily and clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in a selected-area electron diffraction pattern of the nc-OS film obtained by using an electron beam having a probe diameter (e.g., larger than or equal to 50 nm) larger than a diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are observed in some cases. Moreover, in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film having an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film having an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film having an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

The structure described in this embodiment can be used in appropriate combination with the structure described in any of the other embodiments.

[Embodiment 3]

In this embodiment, an example of a display device that includes any of the transistors described in the above embodiment will be described below with reference to FIG. 15, FIG. 16, and FIG. 17.

Figure 15:
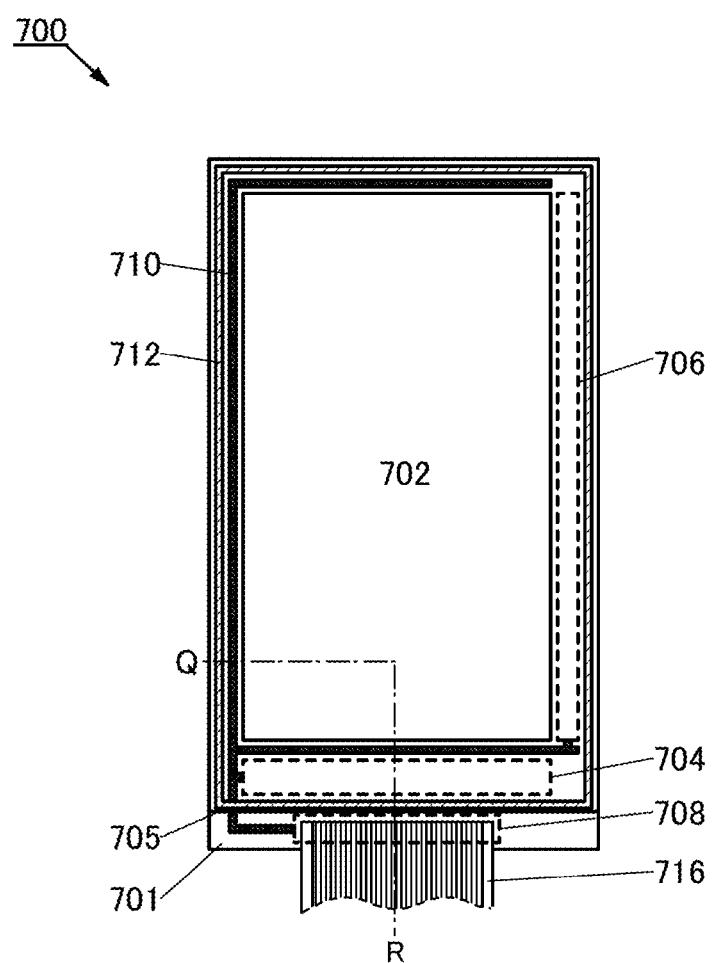
FIG. 15 is a top view illustrating one embodiment of a display device.

FIG. 15 is a top view of an example of a display device. A display device 700 illustrated in FIG. 15 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 15, a display element is provided between the first substrate 701 and the second substrate 705.

In the display device 700, a flexible printed circuit (FPC) terminal portion 708 electrically connected each other to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above elements, display media whose contrast, luminance, reflectivity, transmittance, or the like is changed by an electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared with the case of using the coloring layer in some cases.

In this embodiment, a structure including a liquid crystal element and an EL element as display elements is described with reference to FIG. 16 and FIG. 17. Note that FIG. 16 is a cross-sectional view along the dashed-dotted line Q-R shown in FIG. 15 and shows a structure including a liquid crystal element as a display element, whereas FIG. 17 is a cross-sectional view along the dashed-dotted line Q-R shown in FIG. 15 and shows a structure including an EL element as a display element.

Figure 16:
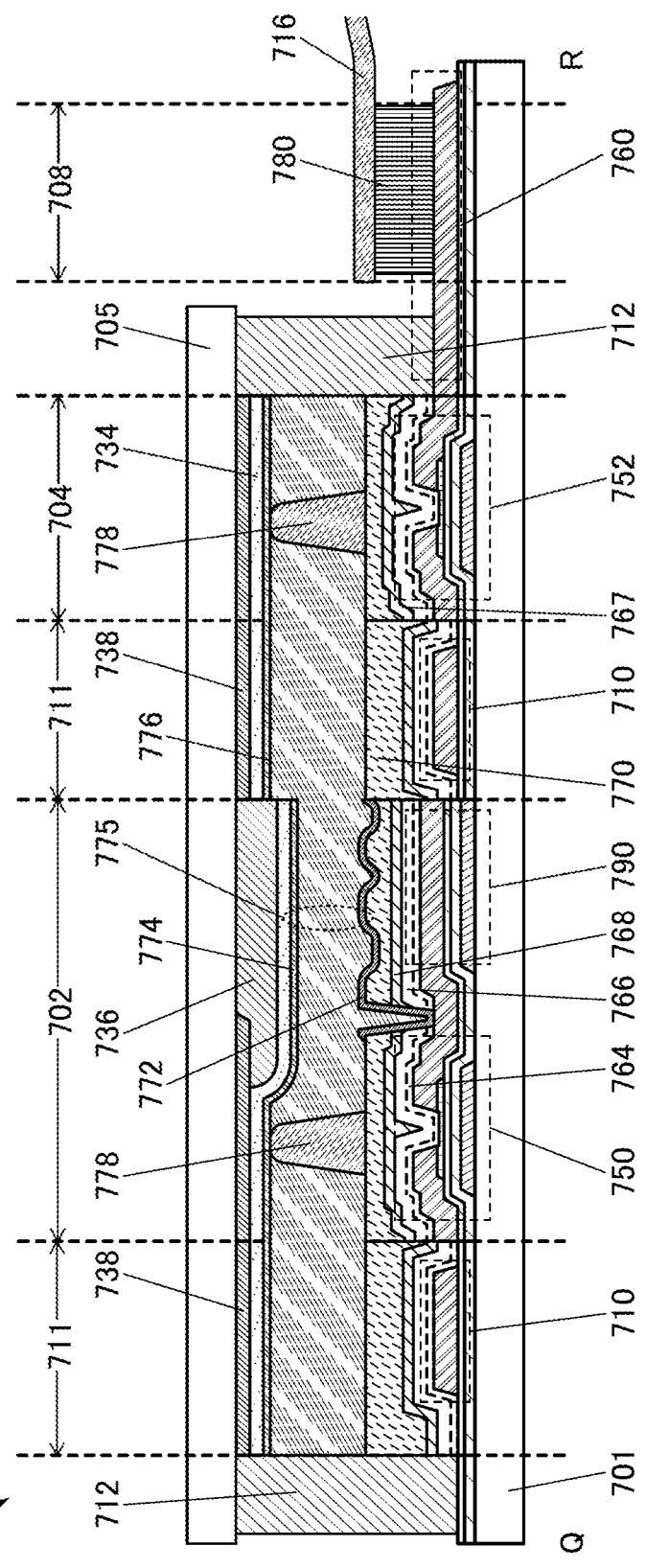
FIG. 16 is a cross-sectional view illustrating one embodiment of a display device.
Figure 17:
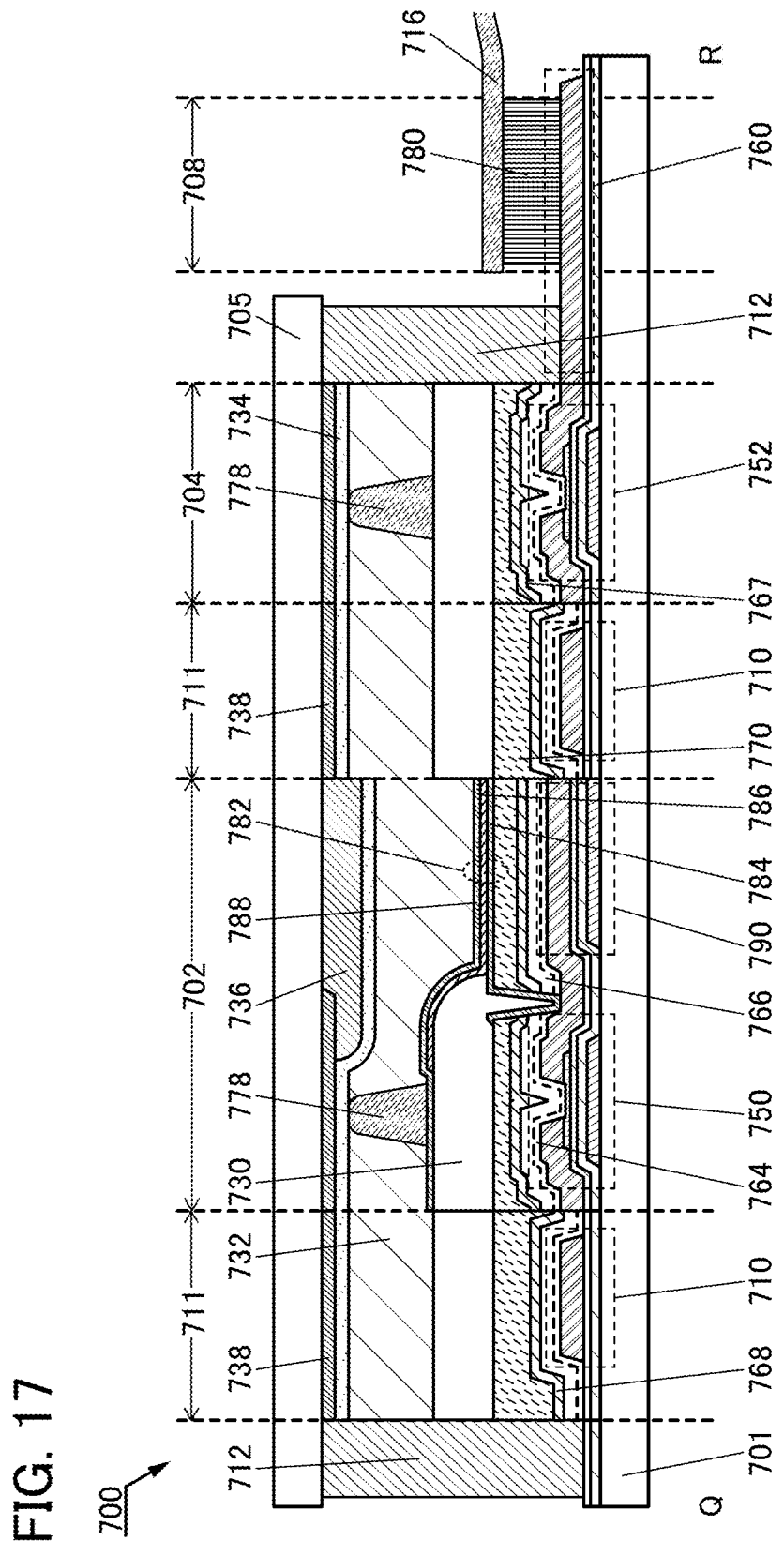
FIG. 17 is a cross-sectional view illustrating one embodiment of a display device.

Common portions between FIG. 16 and FIG. 17 are described first, and then different portions are described.

<Common Portions in Display Devices>

The display device 700 illustrated in FIG. 16 and FIG. 17 include a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancy is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, whereby the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film which is formed using the same step as a conductive film functioning as a gate electrode of the transistor 750 is used as one electrode of the capacitor 790, and a conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 16 and FIG. 17, insulating films 764, 766, and 768, an oxide semiconductor film 767, and a planarization insulating film 770 are formed over the transistor 750, the transistor 752, and the capacitor 790.

The insulating films 764, 766, and 768 can be formed using materials and methods similar to those of the insulating films 114, 116, and 118 described in the above embodiment, respectively. The oxide semiconductor film 767 can be formed using a material and a method similar to those of the oxide semiconductor film 117 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same steps as conductive films functioning as source and drain electrodes of the transistor 750 or 752. Note that the signal line 710 may be formed using a conductive film which is formed in different steps as a source electrode and a drain electrode of the transistor 750 or 752, for example, a conductive film functioning as a gate electrode may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same steps as the conductive films functioning as source and drain electrodes of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 in FIG. 16 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 16 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive film functioning as a source and drain electrode included in the transistor 750. The conductive film 772 is formed over the planarization insulating film 770 to function as a pixel electrode, that is, one electrode of the display element. The conductive film 772 functions as a reflective electrode. The display device 700 in FIG. 16 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material including one of indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used as the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved.

(2) The aluminum film and the silver alloy film can be collectively etched depending on a chemical solution.

(3) The conductive film 772 can have a favorable cross-sectional shape (e.g., a tapered shape).

The reason for (3) is as follows: the etching rate of the aluminum film with the chemical solution is lower than that of the silver alloy film, or etching of the aluminum film that is the bottom layer is developed faster than that of the silver alloy film because, when the aluminum film that is the bottom layer is exposed after the etching of the silver alloy film that is the top layer, electrons are extracted from metal that is less noble than the silver alloy film, that is, aluminum that is metal having a high ionization tendency, and thus etching of the silver alloy film is suppressed.

Note that projections and depressions are provided in part of the planarization insulating film 770 of the pixel portion 702 in the display device 700 in FIG. 16. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 in FIG. 16 is a reflective color liquid crystal display device given as an example, but a display type is not limited thereto. For example, a transmissive color liquid crystal display device in which a conductive film that transmits visible light is used as the conductive film 772 may be used. In the case of a transmissive color liquid crystal display device, projections and depressions are not necessarily provided on the planarization insulating film 770.

Although not illustrated in FIG. 16, an alignment film may be provided on a side of the conductive film 772 in contact with the liquid crystal layer 776 and on a side of the conductive film 774 in contact with the liquid crystal layer 776. Although not illustrated in FIG. 16, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 17 includes a light-emitting element 782. The light-emitting element 782 includes a conductive film 784, an EL layer 786, and a conductive film 788. The display device 700 in FIG. 17 is capable of displaying an image by light emission from the EL layer 786 included in the light-emitting element 782.

The conductive film 784 is connected to the conductive film functioning as a source and drain electrode included in the transistor 750. The conductive film 784 is formed over the planarization insulating film 770 to function as a pixel electrode, that is, one electrode of the display element. A conductive film which transmits visible light or a conductive film which reflects visible light can be used as the conductive film 784. The conductive film which transmits visible light can be formed using a material including one of indium (In), zinc (Zn), and tin (Sn), for example. The conductive film which reflects visible light can be formed using a material including aluminum or silver, for example.

In the display device 700 in FIG. 17, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 in FIG. 17, the structure is not limited thereto. In the case where the EL layer 786 is formed by a separate coloring method, the coloring film 736 is not necessarily provided.

The structure described in this embodiment can be used in appropriate combination with the structure described in any of the other embodiments.

[Embodiment 4]

In this embodiment, a display device that includes a semiconductor device of one embodiment of the present invention will be described with reference to FIGS. 18A to 18C.

The display device illustrated in FIG. 18A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed, in which case the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches, for example. The source driver 504b can output, as the data signals, signals obtained by time-dividing the video signal by sequentially turning on the plurality of analog switches.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 18A:
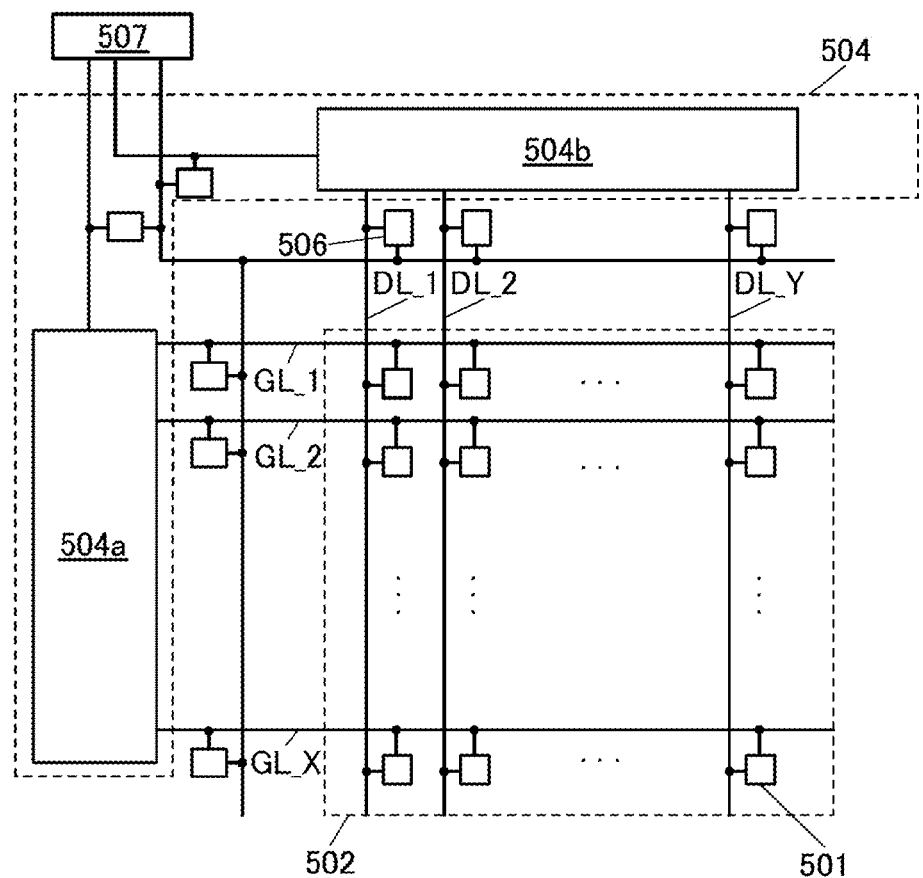
FIGS. 18A to 18C are a block diagram and circuit diagrams illustrating a display device.

The protection circuit 506 illustrated in FIG. 18A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 18A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 18A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 18B:
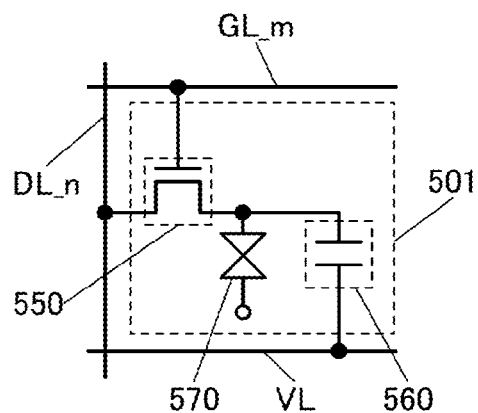

Each of the plurality of pixel circuits 501 in FIG. 18A can have the structure illustrated in FIG. 18B, for example.

The pixel circuit 501 illustrated in FIG. 18B includes a liquid crystal element 570, a transistor 550, and a capacitor 560. As the transistor 550, any of the transistors described in the above embodiment can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 18B, the pixel circuits 501 are sequentially selected row by row by the gate driver 504a illustrated in FIG. 18A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 18C:
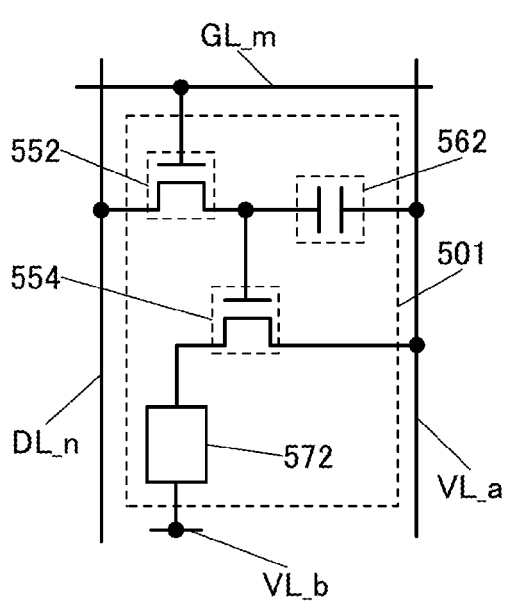

Alternatively, each of the plurality of pixel circuits 501 in FIG. 18A can have the structure illustrated in FIG. 18C, for example.

The pixel circuit 501 illustrated in FIG. 18C includes transistors 552 and 554, a capacitor 562, and a light-emitting element 572. Any of the transistors described in the above embodiment can be used as one or both of the transistors 552 and 554.

One of a source electrode and a drain electrode of the transistor 552 is electrically connected to a wiring to which a data signal is supplied (hereinafter referred to as a data line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 18C, the pixel circuits 501 are sequentially selected row by row by the gate driver 504a illustrated in FIG. 18A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image can be displayed.

The structure described in this embodiment can be used in appropriate combination with the structure described in any of the other embodiments.

[Embodiment 5]

In this embodiment, a display module and electronic appliances that include a semiconductor device of one embodiment of the present invention will be described with reference to FIG. 19 and FIGS. 20A to 20G.

Figure 19:
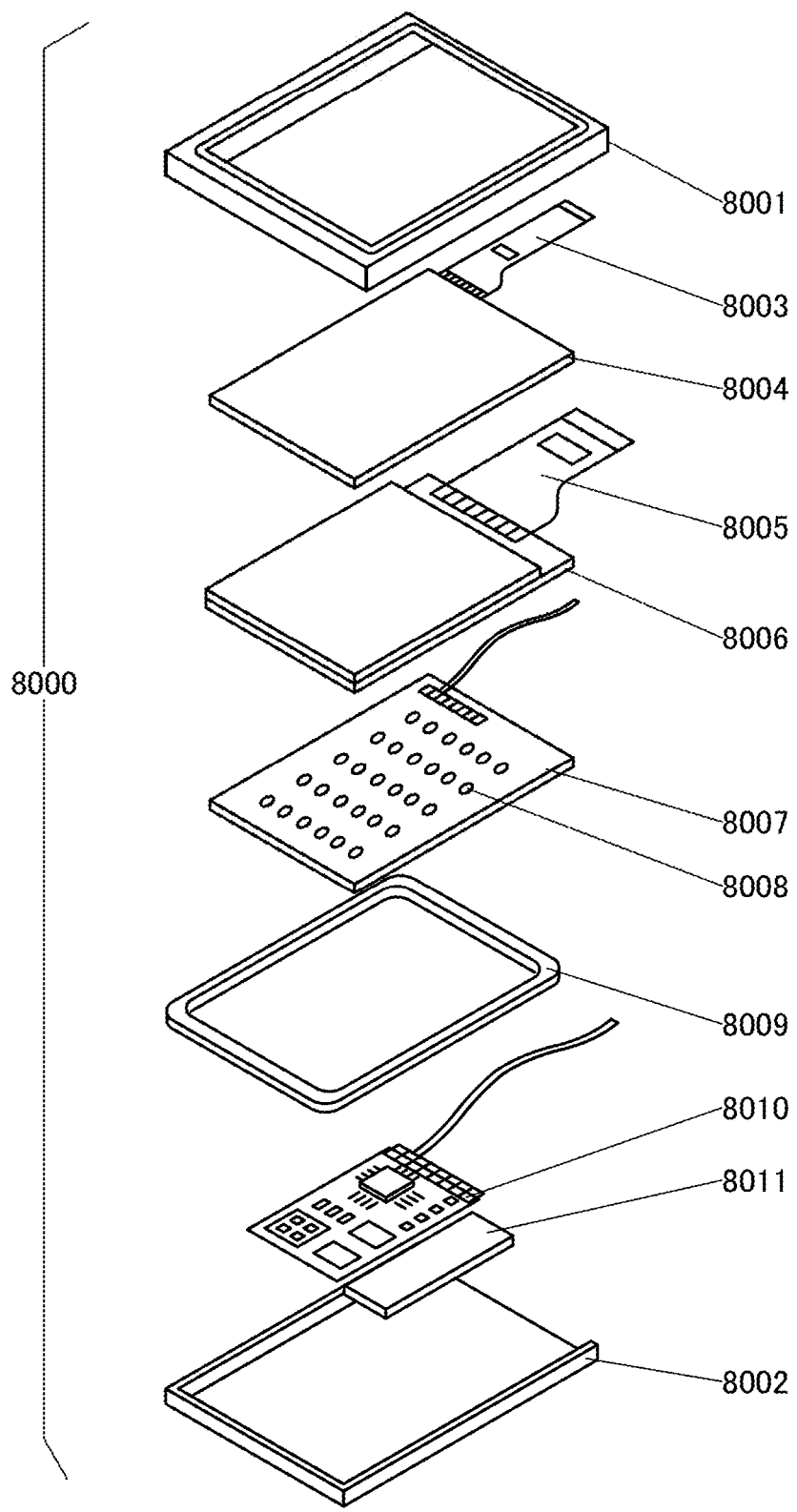
FIG. 19 illustrates a display module.

In a display module 8000 illustrated in FIG. 19, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 19, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 20A to 20G illustrate electronic appliances. These electronic appliances can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic appliances illustrated in FIGS. 20A to 20G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic appliances illustrated in FIGS. 20A to 20G are not limited to those described above, and the electronic appliances can have a variety of functions. Although not illustrated in FIGS. 20A to 20G, the electronic appliance may include a plurality of display portions. Furthermore, the electronic appliance may be provided with a camera and the like and have a function of shooting a still image, a function of shooting a moving image, a function of storing a shot image in a memory medium (an external memory medium or a memory medium incorporated in the camera), a function of displaying a shot image on the display portion, or the like.

The electronic appliances illustrated in FIGS. 20A to 20G are described in detail below.

Figure 20A:
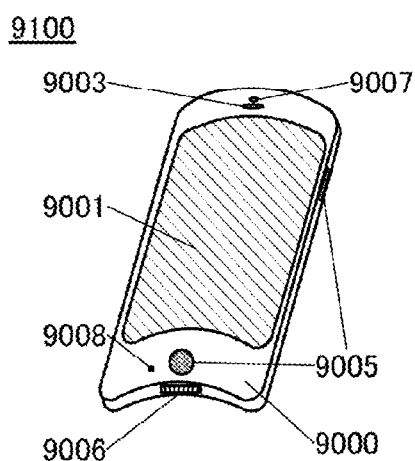
FIGS. 20A to 20G illustrate electronic appliances.

FIG. 20A is a perspective view illustrating a portable information terminal 9100. A display portion 9001 of the portable information terminal 9100 is flexible. Therefore, the display portion 9001 can be incorporated along a bent surface of a bent housing 9000. Furthermore, the display portion 9001 includes a touch sensor, and operation can be performed by touching the screen with a finger, a stylus, or the like. For example, by touching an icon displayed on the display portion 9001, an application can be started.

Figure 20B:
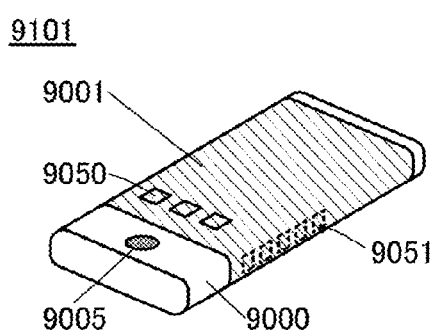

FIG. 20B is a perspective view illustrating a portable information terminal 9101. The portable information terminal 9101 function as, for example, one or more of a telephone set, a notebook, and an information browsing system. Specifically, the portable information terminal 9101 can be used as a smartphone. Note that although the speaker 9003, the connection terminal 9006, the sensor 9007, and the like of the portable information terminal 9101 are not illustrated in FIG. 20B, they can be provided in the same positions as the portable information terminal 9100 in FIG. 20A. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and SNS massage; the date; the time; remaining battery; and the reception strength of an antenna. Alternatively, the operation buttons 9050 or the like may be displayed in place of the information 9051.

Figure 20C:
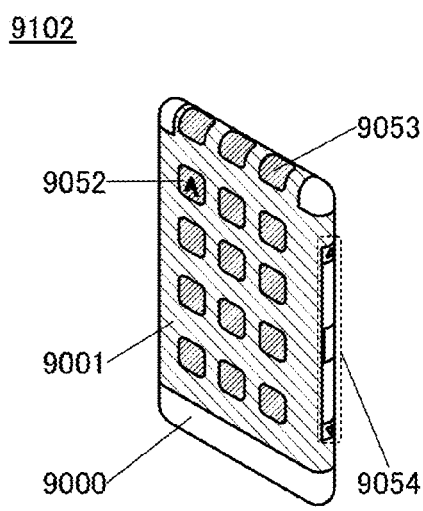

FIG. 20C is a perspective view illustrating a portable information terminal 9102. The portable information terminal 9102 has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 20D:
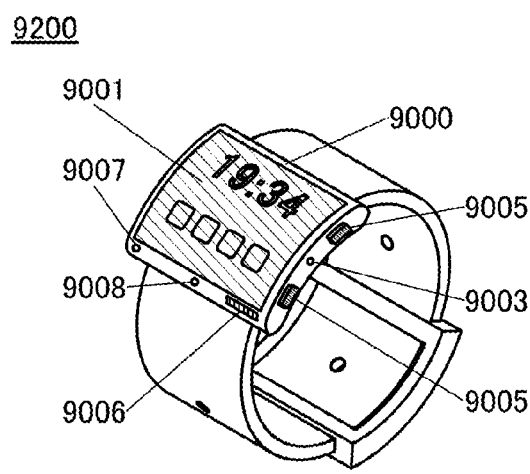

FIG. 20D is a perspective view illustrating a wrist-watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Figure 20E:
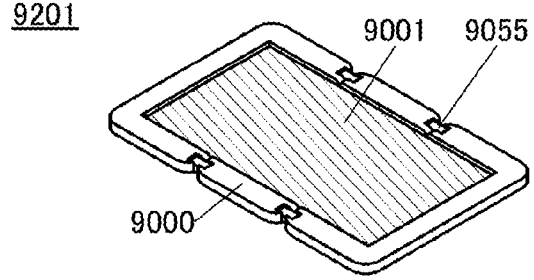
Figure 20F:
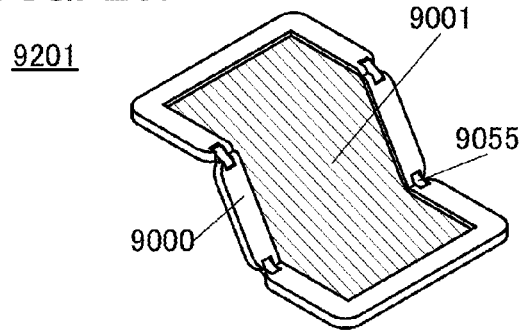
Figure 20G:
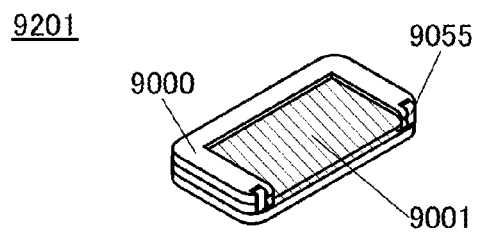

FIGS. 20E, 20F, and 20G are perspective views each illustrating a foldable portable information terminal 9201. FIG. 20E is a perspective view illustrating the portable information terminal 9201 that is opened, FIG. 20F is a perspective view illustrating the portable information terminal 9201 that is being opened or being folded, and FIG. 20G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic appliances described in this embodiment each include the display portion for displaying some sort of data. Note that the semiconductor device of one embodiment of the present invention can also be used for an electronic appliance that does not have a display portion. The structure in which the display portion of the electronic appliance described in this embodiment is flexible and display can be performed on the bent display surface or the structure in which the display portion of the electronic appliance is foldable is described as an example; however, the structure is not limited thereto and a structure in which the display portion of the electronic appliance is not flexible and display is performed on a plane portion may be employed.

The structure described in this embodiment can be used in appropriate combination with any of the structures described in the other embodiments.

EXAMPLE

Figure 21A:
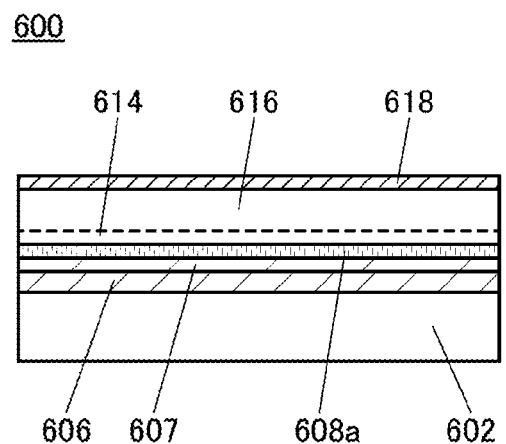
FIGS. 21A to 21C are cross-sectional views illustrating a sample for analysis and a transistor structure in an example.
Figure 21B:
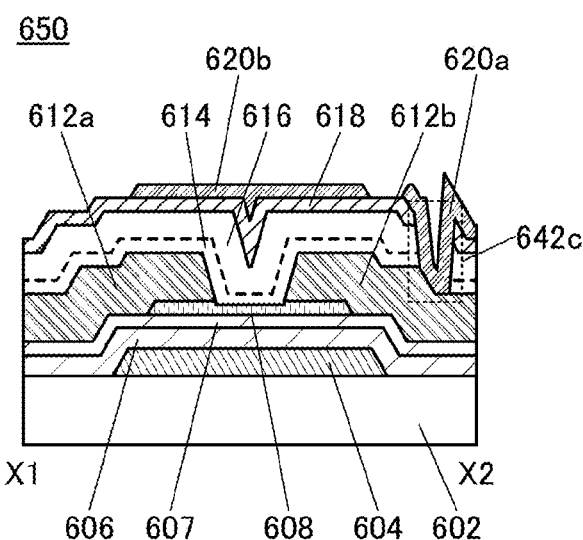
Figure 21C:
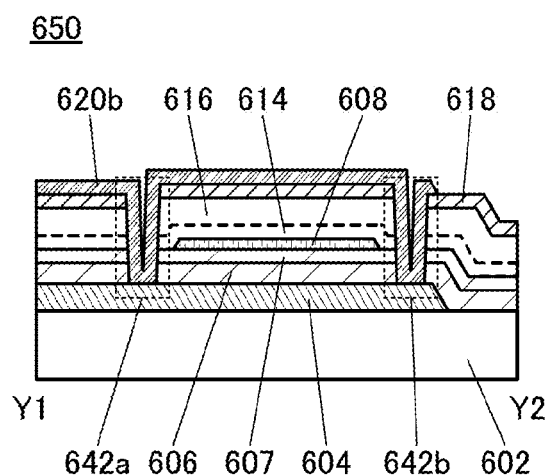

In this example, a sample 600 for analysis illustrated in FIG. 21A and a transistor 650 illustrated in FIGS. 21B and 21C were fabricated, and were subjected to SIMS analysis and electrical characteristic measurement, respectively.

A top view of the transistor 650 in FIGS. 21B and 21C corresponds to the top view of the transistor 170 in FIG. 6A. FIG. 21B is a cross-sectional view in the channel length direction of the transistor 650, and FIG. 21C is a cross-sectional view in the channel width direction of the transistor 650.

In this example, Sample B1 and Sample B2 described below were each fabricated as the sample 600 for analysis. Sample C1 and Sample C2 described below were each fabricated as the transistor 650. Note that Sample B1 and Sample C1 are each the semiconductor device of one embodiment of the present invention, whereas Sample B2 and Sample C2 are each a semiconductor device for comparison.

First, a method for fabricating the sample 600 for analysis which was fabricated in this example is described below.
(Sample B1 and Sample B2)

First, a conductive film was formed over a substrate 602 and was then removed. As the substrate 602, a glass substrate was used. Furthermore, as the conductive film, a 100-nm-thick tungsten film was formed with a sputtering apparatus. The conductive film was removed with a dry etching apparatus.

Next, an insulating film 606 and an insulating film 607 were formed over the substrate 602. As the insulating film 606, a 400-nm-thick silicon nitride film was formed with a PECVD apparatus. As the insulating film 607, a 50-nm-thick silicon oxynitride film was formed with a PECVD apparatus.

Next, an oxide semiconductor film 608a was formed over the insulating film 607. Note that Sample B1 and Sample B2 are different in conditions for forming the oxide semiconductor film 608a.

As the oxide semiconductor film 608a of Sample B1, a 35-nm-thick IGZO film was formed with a sputtering apparatus. Note that the oxide semiconductor film 608a of Sample B1 was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a metal oxide sputtering polycrystalline target (having an atomic ratio of In:Ga:Zn=1:1:1.2).

As the oxide semiconductor film 608a of Sample B2, a 35-nm-thick IGZO film was formed with a sputtering apparatus. Note that the oxide semiconductor film 608a of Sample B2 was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a metal oxide sputtering polycrystalline target (having an atomic ratio of In:Ga:Zn=1:1:1).

Then, first heat treatment was performed. As the first heat treatment, heat treatment was performed at 450° C. in a nitrogen atmosphere for 1 hour and then heat treatment was performed at 450° C. in a mixed atmosphere of nitrogen and oxygen for 1 hour.

Next, a conductive film was formed over the insulating film 607 and the oxide semiconductor film 608a and was then removed. As the conductive film, a 50-nm-thick tungsten film, a 400-nm-thick aluminum film, and a 100-nm-thick titanium film were successively formed in vacuum with a sputtering apparatus. The conductive film was removed with a dry etching apparatus.

Next, a chemical solution was applied over the oxide semiconductor film 608a to clean a surface of the oxide semiconductor film 608a. Note that as the cleaning method, a phosphoric acid solution at a concentration of 85% was diluted by 100 times and was applied over the oxide semiconductor film 608a, and then cleaning was performed for 15 sec.

Next, an insulating film 614 and an insulating film 616 were formed over the oxide semiconductor film 608a. As the insulating film 614, a 50-nm-thick silicon oxynitride film was formed with a PECVD apparatus. As the insulating film 616, a 400-nm-thick silicon oxynitride film was formed with a PECVD apparatus. Note that the insulating films 614 and 616 were formed successively in vacuum with a PECVD apparatus.

The insulating film 614 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 616 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between the parallel-plate electrodes provided in the PECVD apparatus.

Then, second heat treatment was performed. The second heat treatment was performed at 350° C. in a mixed gas atmosphere of nitrogen and oxygen for 1 hour.

Next, after the second heat treatment was performed, the following three steps were performed only on Sample B1.
<1. Step of Forming ITSO Film>

A 5-nm-thick ITSO film was formed over the insulating film 616 with a sputtering apparatus. Note that the composition of a target used for forming the ITSO film was $In_2O_3$:$SnO_2$:$SiO_2$=85:10:5 [wt %].
<2. Step of Oxygen Addition Treatment>

Next, oxygen addition treatment was performed through the ITSO film. The oxygen addition treatment was performed with an ashing apparatus under the conditions where an oxygen gas at a flow rate of 250 sccm was introduced into a chamber, the pressure was 15 Pa, and an RF power of 4500 W was supplied between parallel-plate electrodes provided in the ashing apparatus so that a bias would be applied to the substrate side.
<3. Step of Removing ITSO Film>

Next, the ITSO film was removed to expose the insulating film 616. To remove the ITSO film, with an wet etching apparatus, an oxalic acid solution at a concentration of 5% was applied over the insulating film 616 and etching was performed for 300 sec. and then a hydrofluoric acid at a concentration of 0.5% was applied over the insulating film 616 and etching was performed for 15 sec.

Next, an insulating film 618 was formed over the insulating film 616 both in Sample B1 and Sample B2. As the insulating film 618, a 100-nm-thick silicon nitride film was formed with a PECVD apparatus. The insulating film 618 was deposited under the conditions where the substrate temperature was 350° C.; a silane gas at a flow rate of 50 sccm, a nitrogen gas at a flow rate of 5000 sccm, and an ammonia gas at a flow rate of 100 sccm were introduced into a chamber; the pressure was 100 Pa; and an RF power of 1000 W was supplied between parallel-plate electrodes provided in a PECVD apparatus.

Then, third heat treatment was performed. The third heat treatment was performed at 250° C. in a nitrogen atmosphere for 1 hour.

Through the above process, Sample B1 and Sample B2 of this example were fabricated.

Figure 22A:
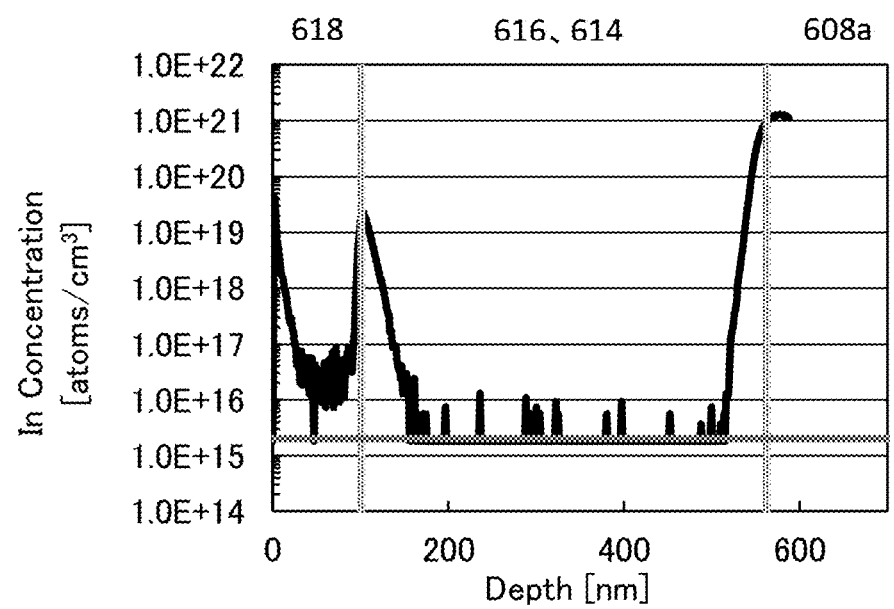
FIGS. 22A and 22B show the results of SIMS analysis in an example.
Figure 22B:
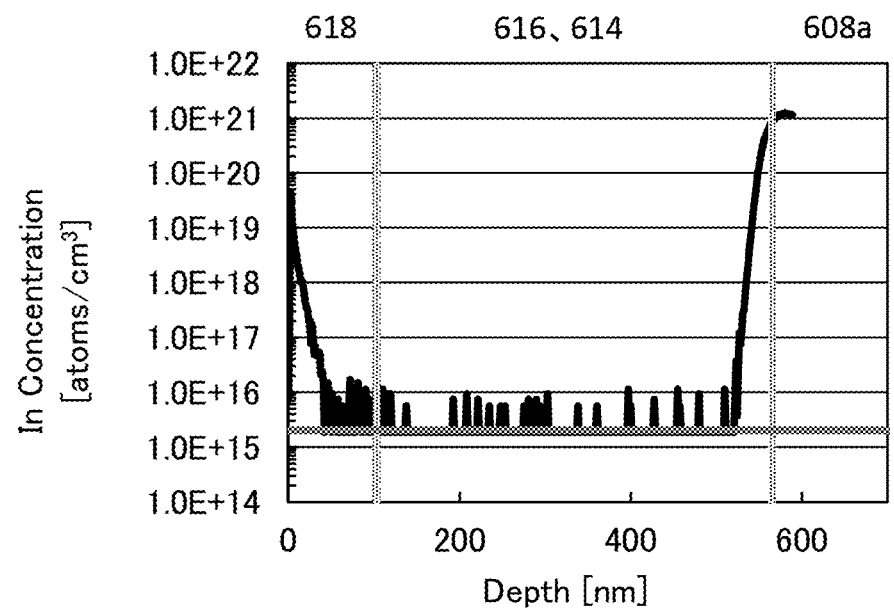

Next, SIMS analysis was performed to measure the concentrations of indium in the oxide semiconductor film 608a and the insulating films 614, 616, and 618 in Sample B1 and Sample B2 which were fabricated as described above. FIG. 22A shows the analysis result of Sample B1, and FIG. 22B shows the analysis result of Sample B2. In FIGS. 22A and 22B, the horizontal axis and the vertical axis represent the depth (nm) and the concentration of indium (atoms/cm$^3$), respectively.

According to the results shown in FIGS. 22A and 22B, in Sample B1, the concentration of indium in the vicinity of the interface between the insulating film 616 and the insulating film 618 was greater than or equal to $5\times10^{16}$ atoms/cm$^3$, whereas in Sample B2, the concentration of indium in the vicinity of the interface between the insulating film 616 and the insulating film 618 was less than $5\times10^{16}$ atoms/cm$^3$. Note that the minimum detection limit of indium in the SIMS analysis is $1\times10^{15}$ atoms/cm$^3$.

When Sample B1 and Sample B2 are compared to each other, the detected amount of indium in the vicinity of the interface between the insulating film 616 and the insulating film 618 in Sample B1 is larger than that in Sample B2.

According to the results shown in FIGS. 22A and 22B, in Sample B1, indium was detected in the vicinity of the interface between the insulating film 616 and the insulating film 618 because indium in the ITSO film used as the film having a function of inhibiting release of oxygen was introduced into the insulating film 616 at the oxygen addition treatment, whereas in Sample B2, no indium was detected in the vicinity of a surface of the insulating film 616, that is, the vicinity of the interface between the insulating film 616 and the insulating film 618 because the step of forming the ITSO film over the insulating film 616, the step of oxygen addition treatment, and the step of removing the ITSO film were not performed.

Since the insulating film 616 includes oxygen, oxygen which is one of its main components cannot be measured accurately in SIMS analysis in some cases even when excess oxygen is included in the insulating film 616. For example, even when the insulating film 616 includes oxygen in excess of that in the stoichiometric composition, it is in some cases difficult to measure oxygen in excess of that in the stoichiometric composition in SIMS analysis. However, in the case as shown in the semiconductor device of one embodiment of the present invention, where the ITSO film is formed as the film having a function of inhibiting release of oxygen over the insulating film 616 and then oxygen is introduced into the insulating film 616 through the ITSO film, indium is detected in the vicinity of the surface of the insulating film 616, that is, the vicinity of the interface between the insulating film 616 and the insulating film 618, as illustrated in FIG. 22A. Therefore, the concentration of an impurity, here, the concentration of indium in the vicinity of the surface of the insulating film 616 is measured, whereby whether the step of adding oxygen to the insulating film 616 is performed can be confirmed in some cases.

As described above, in the case where oxygen in the insulating film 616 cannot be measured accurately in SIMS analysis, it is important to analyze physical properties of the films in contact with the insulating film 616, here, the concentration of indium in the vicinity of the interface between the insulating film 616 and the insulating film 618.

Next, a method for fabricating the transistor 650 fabricated in this example is described below.

(Sample C1 and Sample C2)

As each of Sample C1 and Sample C2, five transistors having a channel length L of 3 μm and a channel width W of 50 μm were fabricated in the substrate.

First, a conductive film was formed over the substrate 602 and processed, whereby a conductive film 604 was formed.

As the conductive film 604, a 100-nm-thick tungsten film was formed with a sputtering apparatus.

Next, the insulating film 606 and the insulating film 607 were formed over the substrate 602 and the conductive film 604.

Next, the oxide semiconductor film 608a was formed over the insulating film 607 and was processed into an island shape, whereby an oxide semiconductor film 608 was formed.

Note that Sample C1 and Sample C2 are different in conditions for forming the oxide semiconductor film 608.

The oxide semiconductor film 608 of Sample C1 was formed under the same conditions as the oxide semiconductor film 608a of Sample B1 described above and was then processed into an island shape.

The oxide semiconductor film 608 of Sample C2 was formed under the same conditions as the oxide semiconductor film 608a of Sample B2 described above and was then processed into an island shape.

Then, first heat treatment was performed.

Next, a conductive film was formed over the insulating film 607 and the oxide semiconductor film 608 and was processed, whereby conductive films 612a and 612b were formed. As the conductive films 612a and 612b, a 50-nm-thick tungsten film, a 400-nm-thick aluminum film, and a 100-nm-thick titanium film were successively formed in vacuum with a sputtering apparatus.

Next, the insulating films 614 and 616 were formed over the oxide semiconductor film 608 and the conductive films 612a and 612b.

Then, second heat treatment was performed.

Next, the step of forming the ITSO film, the step of oxygen addition treatment, and the step of removing the ITSO film were performed on Sample C1 in a manner similar to that of Sample B1 described above. The step of forming the ITSO film, the step of oxygen addition treatment, and the step of removing the ITSO film were not performed on Sample C2 in a manner similar to that of Sample B2 described above.

The insulating film 618 was formed over the insulating film 616.

Next, an opening 642c reaching the conductive film 612b and openings 642a and 642b reaching the conductive film 604 were formed. The openings 642a, 642b, and 642c were formed with a dry etching apparatus.

Next, a conductive film was formed over the insulating film 618 to cover the openings 642a, 642b, and 642c and processed to form conductive films 620a and 620b. As the conductive films 620a and 620b, a 100-nm-thick ITSO film was formed with a sputtering apparatus. The composition of a target used for forming the ITSO film was the same as that used in the step of forming the ITSO film described above.

Then, third heat treatment was performed.

Through the above process, Sample C1 and Sample C2 were fabricated.

Next, electrical characteristics of the transistors in Sample C1 and Sample C2 fabricated as described above were measured. The measured electrical characteristics of Sample C1 and Sample C2 are shown in FIGS. 23A and 23B.

Figure 23A:
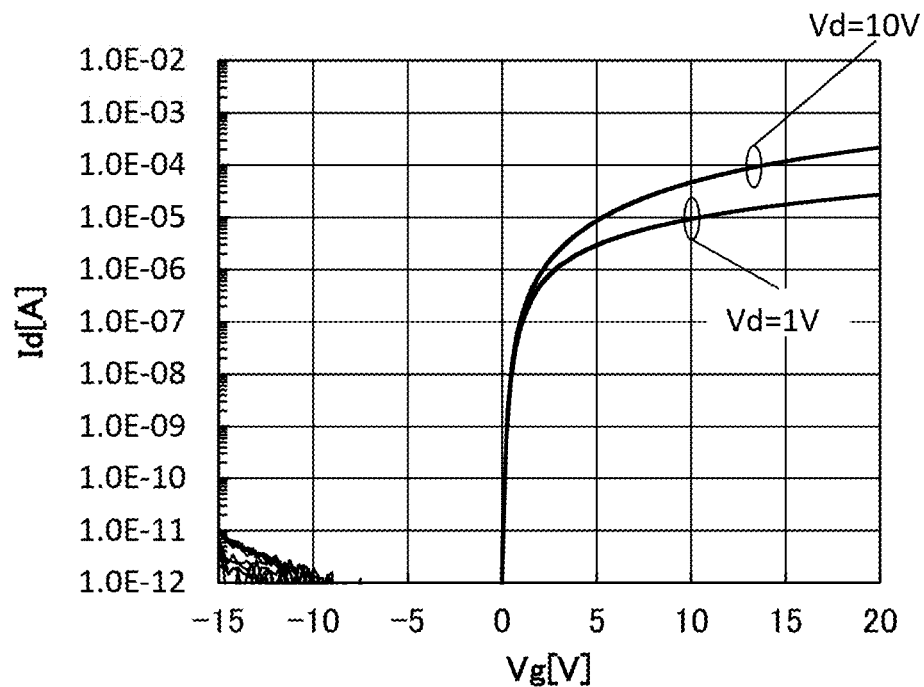
FIGS. 23A and 23B each show the electrical characteristics of transistors in an example.
Figure 23B:
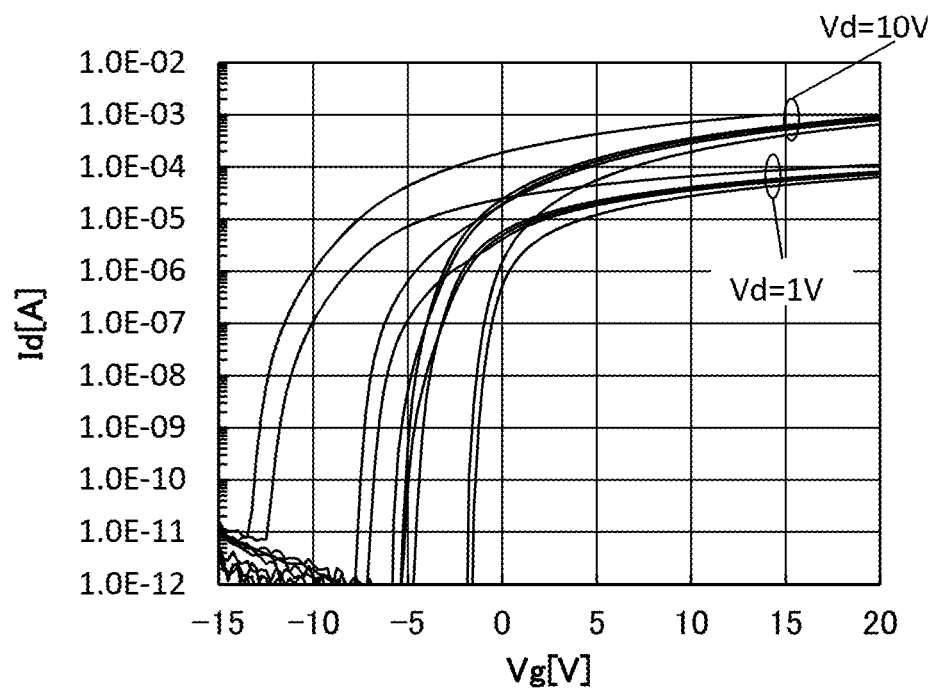

Note that FIG. 23A shows electrical characteristics of Sample C1, and FIG. 23B shows electrical characteristics of Sample C2. In FIGS. 23A and 23B, the horizontal axis and the vertical axis represent gate voltage (Vg) and drain current (Id), respectively, and data of the 5 transistors are superimposed on each other. Furthermore, voltages between the source electrode and the drain electrode (the voltage is expressed as Vd) were set at 1 V and 10 V, and Vg was applied from −15 V to 20 V at intervals of 0.5 V.

The results in FIGS. 23A and 23B show that variation among the transistors is small in Sample C1 of one embodiment of the present invention. Furthermore, Sample C1 has favorable rising characteristics in the vicinity of 0 V. In contrast, variation among the transistors is large in Sample C2 for comparison. Moreover, the transistors have normally-on characteristics in Sample C2.

The results suggest that a difference between Sample C1 and Sample C2 described above in transistor characteristics was due to whether the insulating films 614 and 616 are subjected to oxygen addition treatment or not. In Sample C1 of one embodiment of the present invention, excess oxygen was able to be favorably added to the insulating films 614 and 616 by forming the ITSO film over the insulating film 616 and adding oxygen to the insulating films 614 and 616 through the ITSO film. Transistors having small variation and favorable rising characteristics were formed by filling oxygen vacancy in the oxide semiconductor film 608 with the excess oxygen.

Accordingly, the transistors in Sample C1 of this example have small variation and high reliability.

The structure described above in this example can be combined with any of the structures described in the other embodiments as appropriate.

REFERENCE NUMERALS

100: transistor, 100A: transistor, 100B: transistor, 102: substrate, 104: conductive film, 106: insulating film, 107: insulating film, 108: oxide semiconductor film, 108a: oxide semiconductor film, 108b: oxide semiconductor film, 108c: oxide semiconductor film, 112a: conductive film, 112b: conductive film, 114: insulating film, 116: insulating film, 117: oxide semiconductor film, 118: insulating film, 120: conductive film, 120a: conductive film, 120b: conductive film, 130: film, 139: oxygen, 140c: opening, 141a: opening, 141b: opening, 142: etchant, 142a: opening, 142b: opening, 142c: opening, 150: transistor, 160: transistor, 170: transistor, 180b: oxide semiconductor film, 200: semiconductor device, 202: substrate, 204: insulating film, 206: insulating film, 230: film, 239: oxygen, 242: etchant, 501: pixel circuit, 502: pixel portion, 504: driver circuit portion, 504a: gate driver, 504b: source driver, 506: protective circuit, 507: terminal portion, 550: transistor, 552: transistor, 554: transistor, 560: capacitor, 562: capacitor, 570: liquid crystal element, 572: light-emitting element, 600: sample for analysis, 602: substrate, 604: conductive film, 606: insulating film, 607: insulating film, 608: oxide semiconductor film, 608a: oxide semiconductor film, 612a: conductive film, 612b: conductive film, 614: insulating film, 616: insulating film, 618: insulating film, 620a: conductive film, 620b: conductive film, 642a: opening, 642b: opening, 642c: opening, 650: transistor, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 764: insulating film, 766: insulating film, 767: oxide semiconductor film, 768: insulating film, 770: planarization insulating film, 772: conductive film, 774: conductive film, 775: liquid crystal element, 776: liquid crystal layer, 778: structure body, 780: anisotropic conductive film, 782: light-emitting element, 784: conductive film, 786: EL layer, 788: conductive film, 790: capacitor, 8000: display module, 8001: upper cover, 8002: lower cover, 8003: FPC, 8004: touch panel, 8005: FPC, 8006: display panel, 8007: backlight, 8008: light source, 8009: frame, 8010: printed board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal This application is based on Japanese Patent Application serial no. 2014-126787 filed with Japan Patent Office on Jun. 20, 2014, the entire contents of which are hereby incorporated by reference.

The invention claimed is:

1. A semiconductor device comprising:
a first insulating film;
an oxide semiconductor film over the first insulating film;
a second insulating film over the oxide semiconductor film; and
a third insulating film over the second insulating film,
wherein the second insulating film includes oxygen and silicon,
wherein the third insulating film includes nitrogen and silicon,
wherein indium is included in a vicinity of an interface between the second insulating film and the third insulating film, and
wherein a concentration of indium at the interface is higher than a concentration of indium at a center of the second insulating film.

2. The semiconductor device according to claim 1, wherein the indium is detectable in the vicinity of the interface by secondary ion mass spectrometry.

3. The semiconductor device according to claim 1, wherein the oxide semiconductor film includes O, In, Zn, and M, and
wherein M is Ti, Ga, Sn, Y, Zr, La, Ce, Nd, or Hf.

4. The semiconductor device according to claim 1, wherein the oxide semiconductor film includes a crystal part, the crystal part having a c-axis parallel to a normal vector of a surface over which the oxide semiconductor film is formed.

5. A display device comprising:
the semiconductor device according to claim 1; and
a display element.

6. A display module comprising:
the display device according to claim 5; and
a touch sensor.

7. An electronic appliance comprising:
the semiconductor device according to claim 1; and
at least one of an operation key and a battery.

8. The semiconductor device according to claim 1, wherein a concentration of indium in the vicinity of the interface is greater than or equal to $5 \times 10^{16}$ atoms/cm$^3$.

9. A semiconductor device comprising:
a gate electrode;
a first insulating film over the gate electrode;
an oxide semiconductor film over the first insulating film;
a source electrode electrically connected to the oxide semiconductor film;
a drain electrode electrically connected to the oxide semiconductor film;
a second insulating film over the oxide semiconductor film, the source electrode, and the drain electrode; and a third insulating film over the second insulating film,
wherein the second insulating film includes oxygen and silicon,
wherein the third insulating film includes nitrogen and silicon,
wherein indium is included in a vicinity of an interface between the second insulating film and the third insulating film, and
wherein a concentration of indium at the interface is higher than a concentration of indium at a center of the second insulating film.

10. The semiconductor device according to claim 9,
wherein the indium is detectable in the vicinity of the interface by secondary ion mass spectrometry.

11. The semiconductor device according to claim 9,
wherein the oxide semiconductor film includes O, In, Zn, and M, and
wherein M is Ti, Ga, Sn, Y, Zr, La, Ce, Nd, or Hf.

12. The semiconductor device according to claim 9,
wherein the oxide semiconductor film includes a crystal part, the crystal part having a c-axis parallel to a normal vector of a surface over which the oxide semiconductor film is formed.

13. A display device comprising:
the semiconductor device according to claim 9; and
a display element.

14. A display module comprising:
the display device according to claim 13; and
a touch sensor.

15. An electronic appliance comprising:
the semiconductor device according to claim 9; and
at least one of an operation key and a battery.

16. The semiconductor device according to claim 9,
wherein a concentration of indium in the vicinity of the interface is greater than or equal to $5\times10^{16}$ atoms/cm$^3$.

17. A semiconductor device comprising:
a first insulating film;
an oxide semiconductor film over the first insulating film;
a second insulating film over the oxide semiconductor film; and
a third insulating film over the second insulating film,
wherein the second insulating film includes oxygen and silicon,
wherein indium is included in a vicinity of an interface between the second insulating film and the third insulating film, and
wherein a concentration of indium at the interface is higher than a concentration of indium at a center of the second insulating film.

18. The semiconductor device according to claim 17,
wherein the indium is detectable in the vicinity of the interface by secondary ion mass spectrometry.

19. The semiconductor device according to claim 17,
wherein the oxide semiconductor film includes O, In, Zn, and M, and
wherein M is Ti, Ga, Sn, Y, Zr, La, Ce, Nd, or Hf.

20. The semiconductor device according to claim 17,
wherein the oxide semiconductor film includes a crystal part, the crystal part having a c-axis parallel to a normal vector of a surface over which the oxide semiconductor film is formed.

21. A display device comprising:
the semiconductor device according to claim 17; and
a display element.

22. A display module comprising:
the display device according to claim 21; and
a touch sensor.

23. An electronic appliance comprising:
the semiconductor device according to claim 17; and
at least one of an operation key and a battery.

24. The semiconductor device according to claim 17,
wherein a concentration of indium in the vicinity of the interface is greater than or equal to $5\times10^{16}$ atoms/cm$^3$.

* * * * *